(12) United States Patent
Sakaida et al.

(10) Patent No.: US 9,735,204 B2
(45) Date of Patent: Aug. 15, 2017

(54) SOLID-STATE IMAGING DEVICE AND METHOD FOR MANUFACTURING THE SAME

(71) Applicant: Panasonic Intellectual Property Management Co., Ltd., Osaka (JP)

(72) Inventors: Ryota Sakaida, Osaka (JP); Nobuyoshi Takahashi, Toyama (JP); Kosaku Saeki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 192 days.

(21) Appl. No.: 14/553,559

(22) Filed: Nov. 25, 2014

(65) Prior Publication Data
US 2015/0076500 A1  Mar. 19, 2015

Related U.S. Application Data

(63) Continuation of application No. PCT/JP2013/002750, filed on Apr. 23, 2013.

(30) Foreign Application Priority Data

Jun. 21, 2012 (JP) ................................ 2012-139899

(51) Int. Cl.
*H01L 27/30* (2006.01)
*H01L 27/146* (2006.01)
(Continued)

(52) U.S. Cl.
CPC ...... *H01L 27/307* (2013.01); *H01L 21/28525* (2013.01); *H01L 21/76889* (2013.01);
(Continued)

(58) Field of Classification Search
CPC ................. H01L 27/307; H01L 51/441; H01L 21/28525; H01L 21/76889;
(Continued)

(56) References Cited

U.S. PATENT DOCUMENTS

| | | | |
|---|---|---|---|
| 4,438,455 | A | 3/1984 | Tabei |
| 4,443,813 | A | 4/1984 | Tabei |

(Continued)

FOREIGN PATENT DOCUMENTS

| | | | |
|---|---|---|---|
| JP | 58-103165 A | 6/1983 | |
| JP | 58-103166 A | 6/1983 | |

(Continued)

OTHER PUBLICATIONS

International Search Report issued in International Application No. PCT/JP2013/002750 dated Jul. 16, 2013.

*Primary Examiner* — Kyoung Lee
(74) *Attorney, Agent, or Firm* — McDermott Will & Emery LLP

(57) ABSTRACT

Each imaging pixel provided in a solid-state imaging device includes a charge accumulation part which is a diffusion region formed in a substrate, a gate electrode formed lateral to the charge accumulation part on the substrate, an insulating film formed on the charge accumulation part, and a contact plug connected to the charge accumulation part so as to penetrate the insulating film and made of semiconductor. The contact plug is, at a lower part thereof, embedded in the insulating film, and is, at an upper part thereof, exposed through the insulating film. Silicide is formed on the upper part of the contact plug, and the charge accumulation part and the gate electrode are covered by the insulating film.

16 Claims, 10 Drawing Sheets

(51) Int. Cl.
*H01L 21/768* (2006.01)
*H01L 21/285* (2006.01)
*H01L 23/485* (2006.01)
*H01L 51/44* (2006.01)

(52) U.S. Cl.
CPC ...... *H01L 21/76895* (2013.01); *H01L 23/485* (2013.01); *H01L 27/14612* (2013.01); *H01L 27/14643* (2013.01); *H01L 51/441* (2013.01); H01L 21/76897 (2013.01); H01L 2924/0002 (2013.01)

(58) Field of Classification Search
CPC ............. H01L 21/76895; H01L 23/485; H01L 27/14643; H01L 27/14612; H01L 2924/0002; H01L 21/76897
See application file for complete search history.

(56) References Cited

U.S. PATENT DOCUMENTS

| | | |
|---|---|---|
| 5,932,912 A | 8/1999 | Horita et al. |
| 2001/0010402 A1* | 8/2001 | Matsuki ............ H01L 21/32053 257/754 |
| 2003/0209651 A1 | 11/2003 | Iwasaki |
| 2004/0169127 A1 | 9/2004 | Ohkawa |
| 2006/0192250 A1 | 8/2006 | Lee |
| 2007/0200181 A1* | 8/2007 | Rhodes ............. H01L 27/14609 257/384 |
| 2011/0024859 A1 | 2/2011 | Miyazaki et al. |
| 2011/0073971 A1* | 3/2011 | Takeda .............. H01L 21/28518 257/431 |

FOREIGN PATENT DOCUMENTS

| | | |
|---|---|---|
| JP | S63-62369 A | 3/1988 |
| JP | H01-266745 A | 10/1989 |
| JP | 02-203526 A | 8/1990 |
| JP | 04-343455 A | 11/1992 |
| JP | 07-78783 A | 3/1995 |
| JP | H08-250588 A | 9/1996 |
| JP | H10-284723 A | 10/1998 |
| JP | 2001-210711 A | 8/2001 |
| JP | 2003-332551 A | 11/2003 |
| JP | 2004-095636 A | 3/2004 |
| JP | 2004-119794 A | 4/2004 |
| JP | 2006-245540 A | 9/2006 |
| JP | 2009-130090 A | 6/2009 |
| JP | 2009-259872 A | 11/2009 |
| JP | 2012-64815 A | 3/2012 |
| JP | 2012-064815 A | 3/2012 |

* cited by examiner

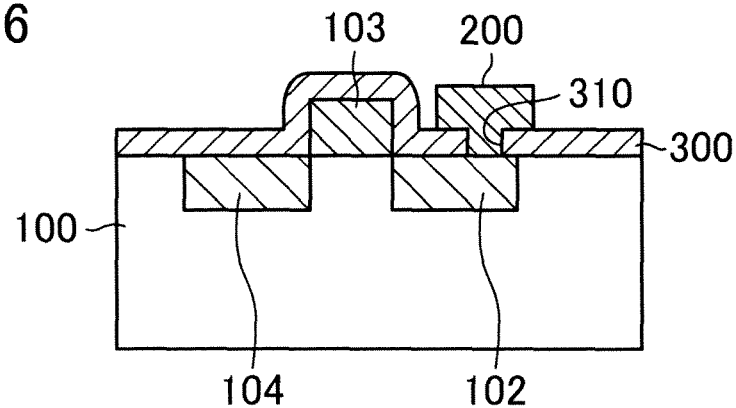
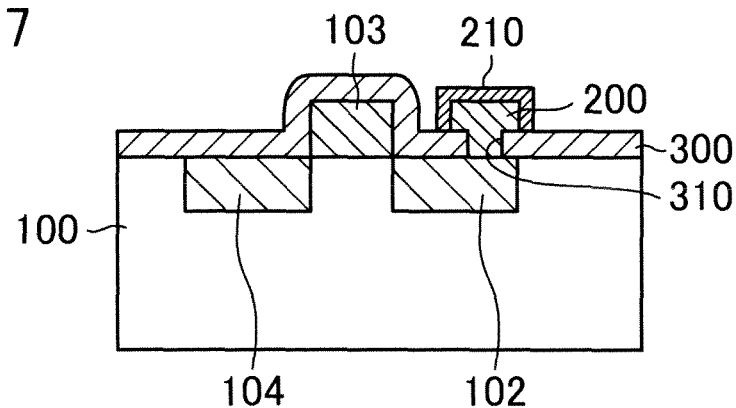
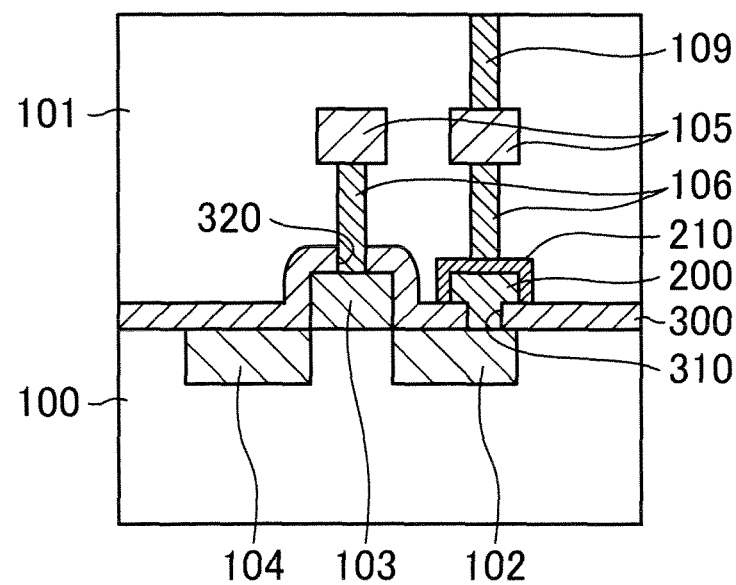

SOLID-STATE IMAGING DEVICE AND METHOD FOR MANUFACTURING THE SAME

CROSS-REFERENCE TO RELATED APPLICATIONS

This is a continuation of International Application No. PCT/JP2013/002750 filed on Apr. 23, 2013, which claims priority to Japanese Patent Application No. 2012-139899 filed on Jun. 21, 2012. The entire disclosures of these applications are incorporated by reference herein.

BACKGROUND

The present disclosure relates to a solid-state imaging device and the method for manufacturing the solid-state imaging device.

Solid-state imaging devices, such as complementary metal-oxide semiconductor (CMOS) sensors and charge-coupled device (CCD) sensors, mounted in digital still cameras etc. each include a plurality of two-dimensionally arranged photodiodes. Conventionally, each photodiode is configured such that a pn junction is formed in a semiconductor substrate.

In recent years, a pixel size has been decreased with increasing the number of pixels and decreasing the size of a solid-state imaging device. Tendency shows that the area of a photodiode region is decreased. A decrease in area of the photodiode region results in lowered sensor characteristics such as reduction in amount of saturation signal charge per pixel or reduction in sensitivity due to, e.g., a lowered aperture ratio and a lowered light collection efficiency.

With reduction in amount of saturation signal charge and degradation of sensitivity characteristics, it is important to reduce noise. One of causes for noise is crystal defects and metal contamination in, e.g., charge accumulation parts and charge reading parts in a pixel region. Particularly in the case where silicide is formed on gate electrodes and diffusion regions in the pixel region, metal for silicide formation diffuses in, e.g., the charge accumulation parts and the charge reading parts. As a result, such metal appears as noise such as white spot.

In order to resolve such a noise issue, solid-state imaging devices in which no silicide is formed in pixel regions are typically employed (see, e.g., Japanese Unexamined Patent Publication No. 2006-245540).

In recent years, solid-state imaging devices having, in order to enhance a light use efficiency, the structure in which an organic photoelectric conversion layer is stacked on a substrate have been developed (see, e.g., Japanese Unexamined Patent Publication No. 2009-130090).

SUMMARY

However, even if no silicide is formed in a pixel region, a metal material such as tungsten or titanium is used for a contact connected to each of diffusion regions formed in a semiconductor substrate, such as charge accumulation parts, charge reading parts, sources and drains. This causes alloying reaction at a contact surface between the diffusion region and the metal contact, resulting in crystal defects.

The contact area between the diffusion region formed in the pixel region of the semiconductor substrate and the metal contact is relatively small. However, for solid-state imaging devices whose size has been reduced, noise due to crystal defects caused at a contact surface cannot be ignorable.

Moreover, the structure in which no silicide is formed in a pixel region results in an increase in contact resistance. Further, there is another disadvantage that contact resistance increases due to reduction in size of solid-state imaging devices, and therefore sensor characteristics such as high-speed operability are degraded.

FIG. 15 shows the correlation between a contact diameter and contact resistance in a contact which is formed on a diffusion region and on which no silicide is formed. Since the correlation between the contact diameter and the contact resistance varies depending on conditions such as the constituent material of a contact, an impurity concentration at a substrate surface, and a processing temperature, FIG. 15 shows a typical example of the correlation between the contact diameter and the contact resistance. Thus, FIG. 15 shows approximate numerical values. Considering circuit operation for high-speed operation, low contact resistance in the order of kilo-ohms (kW is required as contact resistance in a pixel region. However, as the size of a solid-state imaging device having the structure where no silicide is formed in a pixel region decreases, the contact resistance sharply increases, as will be seen from FIG. 15, to resistance in the order of mega-ohms (MΩ).

Particularly for organic solid-state imaging devices, noise due to crystal defects caused at a contact surface between a charge accumulation part which is a diffusion region formed in a semiconductor substrate and a metal contact becomes an issue. A signal charge photogenerated by a photoelectric conversion layer is accumulated in the charge accumulation part formed in the semiconductor substrate. In order to electrically connect the photoelectric conversion layer and the charge accumulation part together, the metal contact is formed on the charge accumulation part. Crystal defects due to alloying reaction are, as described above, caused at the contact surface between the semiconductor substrate in which the charge accumulation part is formed and the metal contact, and become a cause for noise in the charge accumulation part. In the case of the organic solid-state imaging devices, the photoelectric conversion layer generating signals and the charge accumulation part are electrically connected together. Accumulation of noise caused in the charge accumulation part together with a signal charge significantly influences sensor characteristics, resulting in a great issue.

A solid-state imaging device of an aspect of the present disclosure is intended for a solid-state imaging device including an imaging pixel region where a plurality of imaging pixels are arranged on a substrate. Each imaging pixel includes a diffusion region formed in the substrate, a first gate electrode formed lateral to the diffusion region on the substrate, a first insulating film formed on the diffusion region, and a first contact plug connected to the diffusion region so as to penetrate the first insulating film and made of semiconductor. The first contact plug is, at a lower part thereof, embedded in the first insulating film, and is, at an upper part thereof, exposed through the first insulating film. Silicide is formed on the upper part of the first contact plug. The diffusion region and the first gate electrode are covered by the first insulating film.

A solid-state imaging device manufacturing method of an aspect of the present disclosure is intended for the method for manufacturing a solid-state imaging device including an imaging pixel region where a plurality of imaging pixels are arranged on a substrate. The manufacturing method includes a step of forming a diffusion region corresponding to each imaging pixel in the imaging pixel region in the substrate; a step of forming an insulating film on the diffusion region; a step of forming, in the insulating film, a first hole through which the diffusion region is exposed; a step of forming a semiconductor film on the insulating film such that the first hole is filled with the semiconductor film; a step of forming, from the semiconductor film, a first contact plug filling the first hole and exposed through the insulating film; and a step of forming silicide on the first contact plug exposed through the insulating film. A peripheral edge part of the upper part of the first contact plug is formed so as to extend over the insulating film.

The present disclosure is also applicable to a solid-state imaging device in which photodiodes are formed in a semiconductor substrate and a so-called organic solid-state imaging device in which a photoelectric conversion layer made of an organic semiconductor material is formed above a semiconductor substrate.

The "diffusion regions" are regions formed by introduction of impurities into a semiconductor substrate, and include charge accumulation parts capable of accumulating a signal charge, charge reading parts capable of reading a signal charge, sources and drains of transistors, etc.

BRIEF DESCRIPTION OF THE DRAWINGS

FIG. 6 is a schematic cross-sectional view illustrating still another step in the method for manufacturing the solid-state imaging device of the first embodiment.

FIG. 7 is a schematic cross-sectional view illustrating still another step in the method for manufacturing the solid-state imaging device of the first embodiment.

FIG. 8 is a schematic cross-sectional view illustrating still another step in the method for manufacturing the solid-state imaging device of the first embodiment.

DETAILED DESCRIPTION

Figure 1:
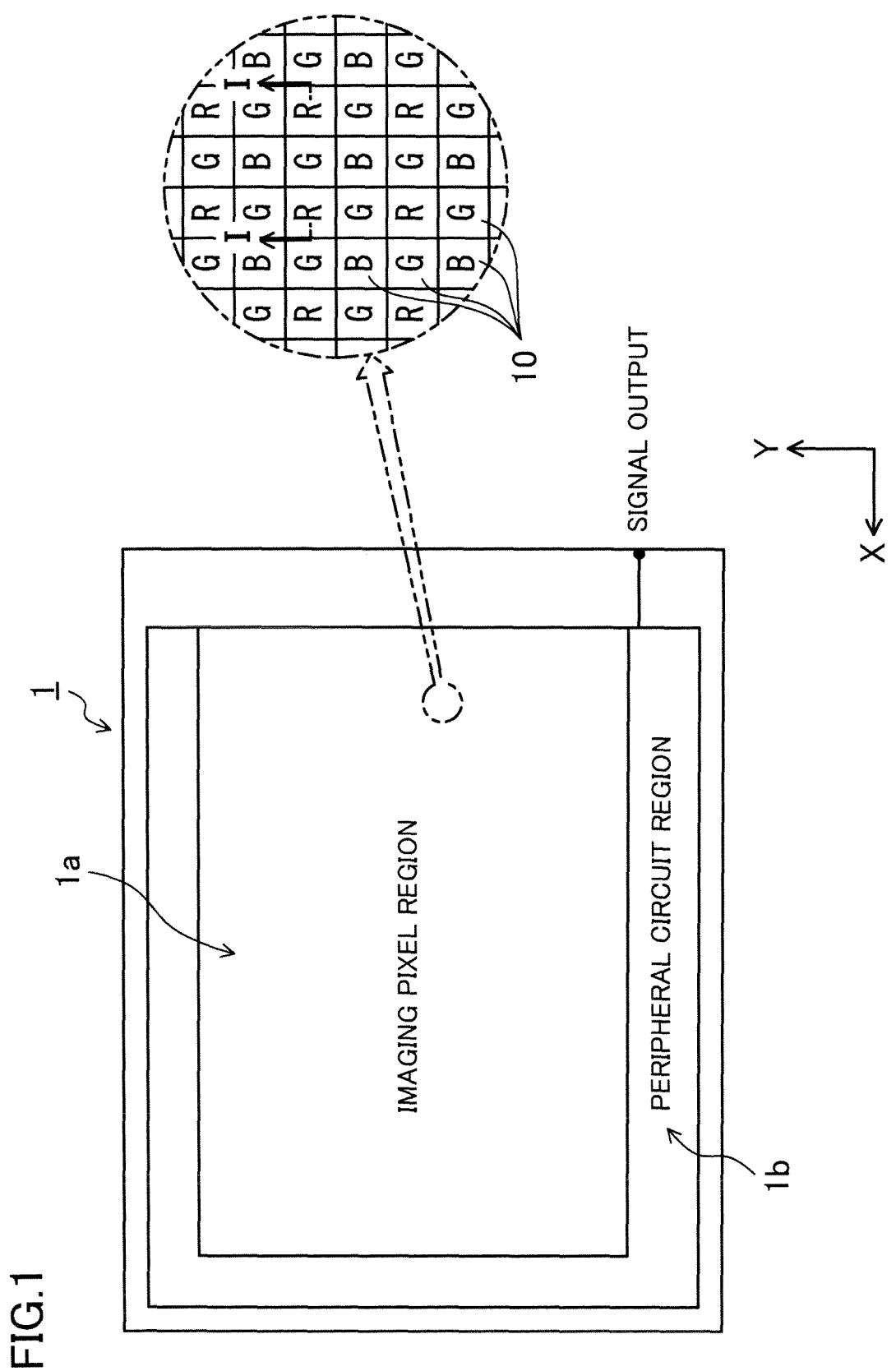
FIG. 1 is a schematic plan view illustrating an outline configuration of a solid-state imaging device of the present disclosure.

A solid-state imaging device of an embodiment of the present disclosure is intended for a solid-state imaging device including an imaging pixel region where a plurality of imaging pixels are arranged on a substrate. Each imaging pixel includes a diffusion region formed in the substrate, a first gate electrode formed lateral to the diffusion region on the substrate, a first insulating film formed on the diffusion region, and a first contact plug connected to the diffusion region so as to penetrate the first insulating film and made of semiconductor. The first contact plug is, at a lower part thereof, embedded in the first insulating film, and is, at an upper part thereof, exposed through the first insulating film. Silicide is formed on the upper part of the first contact plug. The diffusion region and the first gate electrode are covered by the first insulating film.

According to the solid-state imaging device of the embodiment of the present disclosure, since the first contact plug formed in the imaging pixel region is made of semiconductor, no alloying reaction occurs at the contact surface between the first contact plug and the diffusion region. As a result, no noise due to crystal defects is caused. Moreover, although silicide is formed on the upper part of the first contact plug made of semiconductor, the diffusion region and the first gate electrode in the imaging pixel region are protected by the first insulating film in formation of silicide on the upper part of the first contact plug. Thus, no silicide is formed on the diffusion region and the first gate electrode in the imaging pixel region. Consequently, no metal contamination occurs in the imaging pixel region, resulting in low noise. Further, silicide is formed on the upper part of the first contact plug. Thus, even if an upper contact is formed on the first contact plug, the resistance at the contact surface between the upper part of the first contact plug and a bottom part of the upper contact is not high. In the solid-state imaging device of the present disclosure, noise and resistance can be reduced.

In the solid-state imaging device of the embodiment, a peripheral edge part of the upper part of the first contact plug may be formed so as to extend over the first insulating film.

According to the foregoing, it can be ensured that only the upper part of the first contact plug exposed through the first insulating film is silicided. Moreover, since the first contact plug can be connected to the upper contact formed thereon with low resistance, and the area of an upper surface of the first contact plug can be expanded, the allowance for alignment displacement between the contact and the first contact plug can be large.

In the solid-state imaging device of the embodiment, each imaging pixel may further include a second insulating film formed on the first gate electrode, and a second contact plug connected to the first gate electrode so as to penetrate the second insulating film. The second contact plug may be formed of a material identical to the semiconductor forming the first contact plug. The second contact plug may be, at a lower part thereof, embedded in the second insulating film, and is, at an upper part thereof, exposed through the second insulating film. Silicide is formed on the upper part of the second contact plug.

According to the foregoing, the first and second contact plugs made of semiconductor and including the silicided upper parts are connected respectively to the diffusion region and the gate electrode formed in the imaging pixel region. Thus, noise and resistance can be further reduced. Note that, in the case of a contact plug including no silicided upper part, other upper contacts connected respectively to a diffusion region and a gate electrode in an imaging pixel region are formed on the non-silicided region. In this state, since resistance is extremely high, it is necessary for size reduction to adjust and limit temperature conditions etc. in formation of the upper contacts. However, since each upper contact can be, in the case where the upper contacts are formed, formed on the first contact plug made of semiconductor and including the silicided upper part in the solid-state imaging device of the present disclosure, the limitations on temperature conditions etc. in formation of the upper contacts can be much more relaxed as compared to a conventional case.

In this case, the first and second insulating films having an identical composition may continuously form an insulating film.

According to the foregoing, the first insulating film formed on the diffusion region and the second insulating film formed on the gate electrode can be formed by the same step. Moreover, the insulating film forming the first and second contact plugs and the insulating film serving as a block layer for preventing silicidation on the diffusion region and the gate electrode in the imaging pixel region can be formed by the same step. Thus, manufacturing steps can be simplified, and therefore a manufacturing cost of the solid-state imaging device can be reduced.

In the solid-state imaging device of the embodiment, the diffusion region may form a pMOS transistor.

According to the foregoing, in the case where transistors formed in an imaging pixel region are pMOS transistors, the contact resistance in a diffusion region where no silicide is formed is higher as compared to the case of nMOS transistors. Thus, the advantage, i.e., reduction in resistance, obtained by silicidation on the upper part of the first contact plug can be further enhanced.

In the solid-state imaging device of the embodiment, the semiconductor may be boron-doped polysilicon.

According to the foregoing, the first contact plug having low resistance and including the silicided upper part can be formed.

The solid-state imaging device of the embodiment may further include a sidewall formed on one of side surfaces of the first gate electrode; and a third insulating film formed so as to extend from the other side surface of the first gate electrode close to the diffusion region to above the diffusion region. The third insulating film may be, on the diffusion region, formed between the diffusion region and the first insulating film. The first contact plug may penetrate the third insulating film.

According to the foregoing, the third insulating film can be formed using the sidewall formation film. In this case, since the third insulating film formed on the diffusion region is not removed by, e.g., etching, no damage due to etching in sidewall formation is caused in the diffusion region. As a result, noise can be further reduced.

In this case, the sidewall may be formed of a multilayer film in which at least two insulating films are stacked on each other. The third insulating film may be one of the insulating films forming the multilayer film.

According to the foregoing, since the thickness of the third insulating film remaining on the diffusion region can be small, a hole for forming the first contact plug made of semiconductor can be easily formed.

In the case where the solid-state imaging device of the embodiment includes the second contact plug, the contact diameter of the first contact plug at the lower part thereof may be smaller than that of the second contact plug at the lower part thereof.

According to the foregoing, the contact area between the diffusion region and the first contact plug made of semiconductor is small. Thus, etching damage on the diffusion region when the hole is formed by, e.g., etching in the first insulating film to form the first contact plug is small. As a result, noise can be reduced. Moreover, since the contact area between the first gate electrode and the second contact plug made of semiconductor is large, the contact resistance between the first gate electrode and the second contact plug can be reduced. Note that, even if the contact area between the first gate electrode and the second contact plug becomes larger, damage on the diffusion region when the hole is formed by, e.g., etching in the first insulating film does not increase.

In the solid-state imaging device of the embodiment, a center bottom part of the lower part of the first contact plug may be embedded in a recessed part formed in the diffusion region.

According to the foregoing, the area of the diffusion region exposed by dry etching causing great damage in formation of the hole in the first insulating film can be small. Thus, damage on the diffusion region can be reduced, and the exposed area of the diffusion region can be increased by wet etching causing little damage. Thus, resistance can be further reduced.

In the solid-state imaging device of the embodiment, the diffusion region, the first gate electrode, and the first contact plug may contain silicon as a main component.

According to the foregoing, silicon has high charge mobility, and is advantageous in advancement of size reduction technology and low cost performance.

The solid-state imaging device of the embodiment may further includes a second gate electrode formed on the substrate in a region opposite to the first gate electrode relative to the diffusion region; and a contact formed on the first contact plug and having conductivity. Part of an upper lateral part of the first contact plug may be positioned on a sidewall formed above or lateral to the first gate electrode. The remaining part of the upper lateral part of the first contact plug may be positioned on a sidewall formed above or lateral to the second gate electrode. A recessed part may be formed at an upper part of the first contact plug above the diffusion region. The contact may be connected to the recessed part formed at the upper part of the first contact plug.

According to the foregoing, since the contact area between the first contact plug and the conductive contact connected to the first contact plug can be large, the contact resistance between the first contact plug and the contact can be further reduced.

In the case where the solid-state imaging device of the embodiment includes the second contact plug, the first and second contact plugs may be integrally formed together.

According to the foregoing, the contact plug including the silicided upper part is formed so as to extend over both of the diffusion region and each gate electrode. Thus, the contact plug also functions as an interconnection connecting the diffusion region and each gate electrode together. Moreover, since the upper part of the contact plug is silicided, the diffusion region and each gate electrode can be connected together with low resistance.

The solid-state imaging device of the embodiment may further include another diffusion region adjacent to the diffusion region; the first insulating film formed on the another diffusion region; and a third contact plug connected to the another diffusion region so as to penetrate the first insulating film and made of semiconductor. The third contact plug may be made of a material identical to the semiconductor forming the first contact plug. The third contact plug may be, at a lower part thereof, embedded in the first insulating film, and may be, at an upper part thereof, exposed through the first insulating film. Silicide may be formed on the upper part of the third contact plug. The first and third contact plugs may be integrally formed together.

According to the foregoing, the contact plug including the silicided upper part is formed so as to extend over the diffusion regions of adjacent transistors. Thus, the contact plug also functions as an interconnection connecting adjacent diffusion regions together. Moreover, since the upper part of the contact plug is silicided, the diffusion regions can be connected together with low resistance.

The solid-state imaging device of the embodiment may further include a photoelectric conversion layer formed above the diffusion region. The diffusion region may be a charge accumulation part.

According to the foregoing, in an organic solid-state imaging device, occurrence of noise, which significantly influence sensor characteristics, in the charge accumulation part can be reduced.

In this case, the solid-state imaging device of the embodiment may further include a contact formed on the first contact plug and having conductivity. The photoelectric conversion layer may be electrically connected to the charge accumulation part through the first contact plug and the contact.

According to the foregoing, since the contact having conductivity does not directly contact the charge accumulation part, no crystal defects due to alloying reaction occur. Thus, the contact formed on the first contact plug may be made of a metal material such as tungsten (W) or titanium (Ti). It can be ensured that contact resistance is reduced.

The method for manufacturing a solid-state imaging device according to the embodiment of the present disclosure is intended for the method for manufacturing a solid-state imaging device including an imaging pixel region where a plurality of imaging pixels are arranged on a substrate. The method includes a step of forming a diffusion region corresponding to each imaging pixel in the imaging pixel region in the substrate; a step of forming an insulating film on the diffusion region; a step of forming, in the insulating film, a first hole through which the diffusion region is exposed; a step of forming a semiconductor film on the insulating film such that the first hole is filled with the semiconductor film; a step of forming, from the semiconductor film, a first contact plug filling the first hole and exposed through the insulating film; and a step of forming silicide on the first contact plug exposed through the insulating film. A peripheral edge part of the upper part of the first contact plug is formed so as to extend over the insulating film.

According to the manufacturing method of the embodiment, the contact plug connected to the diffusion region, having low resistance, and including the silicided upper part can be formed.

The manufacturing method of the embodiment further includes a step of forming, before the step of forming the insulating film, a gate electrode lateral to the diffusion region on the substrate. The step of forming the first hole includes a step of forming a second hole through which the gate electrode is exposed. The step of forming the first contact plug includes a step of forming, from the semiconductor film, a second contact plug filling the second hole and exposed through the insulating film. At the step of forming the silicide, silicide is simultaneously formed on the second contact plug exposed through the insulating film. A peripheral edge part of an upper part of the second contact plug extends over the insulating film.

According to the foregoing, the contact plug connected to the gate electrode, having low resistance, and including the silicided upper part can be formed.

In the manufacturing method of the embodiment, at the step of forming the first contact plug, at least part of a region, where the first contact plug is not formed, of the insulating film in a thickness direction thereof may remain.

According to the foregoing, it can be ensured that silicidation on the gate electrode and the diffusion region positioned below the region where no contact plug is formed is reduced or prevented.

In the manufacturing method of the embodiment, the diffusion region and the first contact plug may contain silicon as a main component.

According to the foregoing, silicon has high charge mobility, and is advantageous in advancement of size reduction technology and low cost performance.

The solid-state imaging device of the present disclosure can be manufactured by, e.g., a publicly-known process for manufacturing a semiconductor integrated circuit or an organic solid-state imaging device. The outline of such a process includes, e.g., repetition of pattern formation by lithography and etching, formation of diffusion regions by ion implantation, application of a material for device formation by sputtering or chemical vapor deposition (CVD), removal of non-patterned part, and a required thermal process. In the case of a so-called organic solid-state imaging device including a photoelectric conversion layer made of, e.g., an organic semiconductor material, the process and operation for forming an organic photoelectric conversion layer and transparent electrodes are added.

The present disclosure is also applicable to a solid-state imaging device in which photodiodes are formed in a semiconductor substrate and to an organic solid-state imaging device where a photoelectric conversion layer made of an organic semiconductor material is formed on a semiconductor substrate.

The solid-state imaging device includes, in or above the semiconductor substrate thereof, regions and members such as photoelectric conversion parts, charge transfer parts, charge reading parts, electrodes, interconnections, and charge accumulation parts.

A semiconductor material having high charge mobility is used for the charge transfer parts and the charge reading parts. In particular, silicon is preferable as the semiconductor material, considering advancement of size reduction technology and low cost performance.

Although there are various methods for transferring and reading a charge, any of the methods may be employed. Preferably, a CMOS method or a CCD method is employed. Considering high-speed reading of a charge, addition of pixel charges, reading of part of a charge, and low power consumption, it is often the case that the CMOS method is more preferable than the CCD method.

In the case of the organic solid-state imaging device, each region for accumulating, transferring, or reading a charge can use, as a reference, the techniques described in, e.g., Japanese Unexamined Patent Publication No. S58-103165, Japanese Unexamined Patent Publication No. S58-103166, and Japanese Unexamined Patent Publication No. 2003-332551.

For example, in the case of a solid-state imaging device using MOS transistors, a charge is photogenerated in a photoelectric conversion part by incident light, and voltage is applied to a predetermined electrode. Then, the charge is transferred to the electrode by an electric field generated in the photoelectric conversion part. Subsequently, the charge is further transferred to a charge accumulation part of a semiconductor substrate, and is accumulated in the charge accumulation part. The charge accumulated in the charge accumulation part is transferred to a charge reading part by switching of the MOS transistor, and then is read as an electric signal. The electric signal is output to an external circuit.

In the case of the organic solid-state imaging device, optional metals may be used for semiconductor-substrate-side pixel electrodes of the electrodes contacting the photoelectric conversion layer and for interconnections connected to the pixel electrodes. Of these metals, copper (Cu), aluminum (Al), silver (Ag), gold (Au), chrome (Cr), tungsten (W), or an alloy thereof is preferably used for the pixel electrodes and the interconnections. Of the electrodes contacting the photoelectric conversion layer, a counter electrode provided on the side opposite to the semiconductor substrate may be also made of any of optional metals. In particular, indium tin oxide (ITO) or indium zinc oxide (IZO) having high light transmittance is preferable.

Note that, in any of the cases of a solid-state imaging device and an organic solid-state imaging device each including photodiodes in a semiconductor substrate, members such as a color filter capable of distributing light into colors of red, green, and blue (RGB) and a microlens capable of collecting incident light are provided.

Next, the contact plug provided in the solid-state imaging device of the present disclosure will be described.

The solid-state imaging device of the present disclosure includes, in the imaging pixel region, the contact plugs made of semiconductor and including the selectively-silicided upper parts. The material containing polysilicon, germanium (Ge), or gallium arsenide (GaAs) is preferable as the semiconductor material forming the contact plug. Moreover, the semiconductor may be doped with, e.g., impurities of phosphorus (P) or boron (B). Cobalt (Co), nickel (Ni), or platinum (Pt) is preferable as the material used for silicide.

In the imaging pixel region of the semiconductor substrate, the diffusion regions for forming the imaging pixels are formed. In each diffusion region, a source/drain forming the transistor is provided. Moreover, in the case of a solid-state imaging device in which photodiodes are provided in a semiconductor substrate, the photodiodes, charge accumulation parts, and charge reading parts are provided in the semiconductor substrate. In the case of an organic solid-state imaging device, charge accumulation parts etc. are provided.

A gate insulating film is formed on a principal surface of the semiconductor substrate, and the gate electrodes forming, e.g., transistors capable of reading a signal charge are formed on the gate insulating film. A sidewall is formed on a side surface of the gate electrode. Silicon oxide, silicon nitride, or a multilayer film thereof is used for the sidewall.

Moreover, the insulating film is formed on the diffusion regions of the semiconductor substrate and the gate electrodes. The insulating film covering the diffusion regions and the gate electrodes may be formed of a single layer, or may be a multilayer film of a plurality of materials. In order to cause each contact plug made of semiconductor to contact the diffusion region or the gate electrode, the holes through each of which the diffusion region or the gate electrode is exposed are formed in the insulating film by, e.g., dry etching. The semiconductor film is, on the insulating film provided with the holes across the entirety of an upper surface of the semiconductor substrate, formed so as to fill the holes. Part of the semiconductor film other than a desired region is removed by, e.g., etching. Thus, each contact plug made of semiconductor is in such a shape that the contact plug is, at the lower part thereof, embedded in the insulating film and extends, at the upper part thereof, over the peripheral edge part of the hole formed in the insulating film.

That is, in the present disclosure, the semiconductor film for formation of the contact plugs is formed on the insulating film formed on the diffusion regions and the gate electrodes. Thus, the insulating film functions to protect, in etching of the semiconductor film, the diffusion regions positioned below the semiconductor film from etching damage.

The configuration is employed, in which part of the insulating film formed between each diffusion region and the semiconductor film and between each gate electrode and the semiconductor film remains without being removed by etching. The remaining part of the insulating film can be used as the silicide block layer in silicidation. Thus, part of the insulating film serving as the silicide block layer remains in the region where no silicide is formed. On the other hand, if part of the insulating film serving as the silicide block layer is removed from, e.g., a peripheral circuit region where silicide is formed on gate electrodes, sources, and drains, silicide can be formed only on a desired region.

Further, since the upper part of the contact plug made of semiconductor is positioned above the insulating film serving as the silicide block layer, silicide is self-alignedly formed on such an exposed part of the contact plug. Thus, the contact plug can be formed, which is made of semiconductor, whose upper part is silicided, and whose lower part is embedded in the hole of the insulating film and is not silicided.

As just described, the insulating film functioning to protect the diffusion regions of the semiconductor substrate from etching damage and the insulating film serving as the silicide block layer can be formed by a single step. Thus, the film formation step can be simplified, and therefore a manufacturing cost can be reduced accordingly.

The upper contact connected to the contact plug made of semiconductor may be a contact (metal contact) made of metal such as tungsten (W) or titanium (Ti). In a conventional solid-state imaging device, a contact directly contacting a diffusion region or a gate electrode is a metal contact. However, the solid-state imaging device of the present disclosure has the structure in which the contact plug made of semiconductor and including the silicided upper part is disposed between the diffusion region and the metal contact or between the gate electrode and the metal contact in the imaging pixel region. That is, the diffusion region of the semiconductor substrate or the gate electrode is electrically connected to the upper metal contact through the contact plug including the silicided upper part.

Embodiments of the present disclosure will be described below with reference to drawings. Note that each of the embodiments described below is an example used for clearly explaining the configuration of the present disclosure and the features and advantages achieved by the present disclosure, and features of the embodiments other than essential features do not limit the present disclosure.

First Embodiment

In a first embodiment, the case where a solid-state imaging device of the present disclosure is an organic solid-state imaging device will be described.

(1) Outline Configuration of Solid-State Imaging Device

Referring to FIG. 1, a solid-state imaging device 1 of the first embodiment includes an imaging pixel region 1a where a plurality of imaging pixels are arranged in arrays, and a peripheral circuit region 1b where a logic circuit capable of processing a signal output from each imaging pixel is formed. Specifically, signals are read from the imaging pixel region 1a to the peripheral circuit region 1b, and then are output to the outside. As illustrated in the enlarged view of FIG. 1, the imaging pixels 10 are two-dimensionally arranged in the imaging pixel region 1a of the solid-state imaging device 1. The imaging pixels 10 are in predetermined arrangement such that each imaging pixel 10 corresponds to one of color filters R, G, B.

(2) Configuration of Each Imaging Pixel in Solid-State Imaging Device

Figure 2:
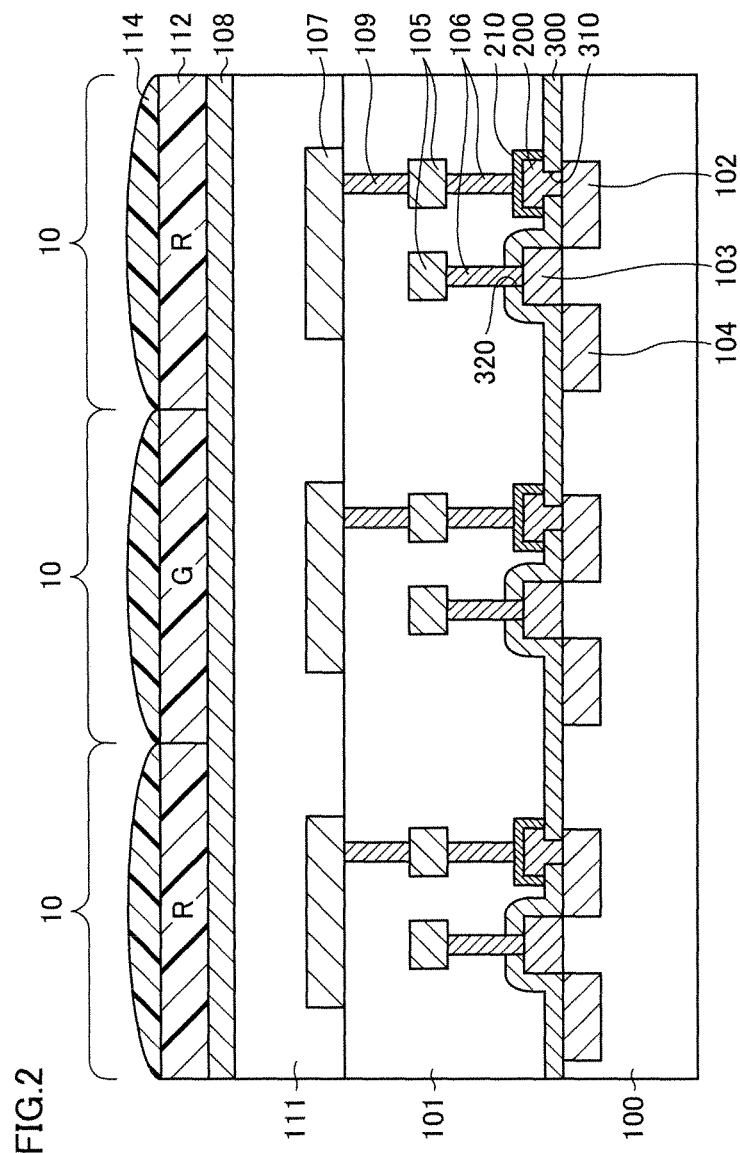
FIG. 2 is a schematic cross-sectional view illustrating part of an imaging pixel region in a solid-state imaging device of a first embodiment.

FIG. 2 illustrates a schematic cross-sectional configuration of part of the imaging pixel region 1a along an I-I line of FIG. 1.

Referring to FIG. 2, an interlayer insulating layer 101, a photoelectric conversion layer 111, a counter electrode 108, color filters 112, and top lenses (microlenses) 114 are stacked on a substrate 100 in this order from the substrate 100 in a Z-axis direction (i.e., a normal direction of a substrate surface).

Charge accumulation parts 102 and charge reading parts 104 which are diffusion regions formed apart from each other in an X-axis direction are formed in an upper part of the substrate 100. In each region between the charge accumulation part 102 and the charge reading part 104, a gate electrode 103 is provided on a principal surface of the substrate 100 with a gate insulating film (not shown in the figure) being interposed between the gate electrode 103 and the substrate 100.

In a region other than each contact region between a contact plug 200 and a metal contact 106, an insulating film 300 is formed on the charge accumulation parts 102 and the gate electrodes 103. The contact plug 200 is made of semiconductor, and is formed so as to penetrate a hole 310 formed above the charge accumulation part 102 in the insulating film 300. Thus, the contact plug 200 contacts the charge accumulation part 102.

The gate electrode 103 and the contact plug 200 are, through the metal contact 106, connected to an interconnection 105 formed in the interlayer insulating layer 101. The metal contact 106 directly connected to the gate electrode 103 is, at a lower part thereof, embedded in a hole 320 formed in the insulating film 300 so as to contact the gate electrode 103. Although not shown in the figure, other diffusion regions such as sources and drains forming transistors are formed in an upper part of the substrate 100 other than the charge reading parts 104 and the charge accumulation parts 102. A metal contact 106 embedded, at a lower part thereof, in a hole 320 formed in the insulating film 300 is also formed so as to contact each of these diffusion regions.

Silicide 210 is formed on upper and side surfaces of part of the semiconductor contact plug 200 exposed through the insulating film 300. In other words, no silicide is formed on a lower part of the contact plug 200 embedded in the insulating film 300, and the silicide 210 is formed on an upper part of the contact plug 200 exposed through the insulating film 300. For example, cobalt (Co), nickel (Ni), or platinum (Pt) may be used as the material of the silicide 210. Note that the contact plug 200 illustrated in FIG. 2 is deemed to include the silicide 210 as part of the contact plug 200. The same applies to the description made below.

A pixel electrode 107 is formed corresponding to each imaging pixel 10 at the boundary between the interlayer insulating layer 101 and the photoelectric conversion layer 111. Each pixel electrode 107 is, through an upper contact 109 formed therebelow, connected to a corresponding one of the interconnections 105 formed in the interlayer insulating layer 101.

A semiconductor substrate formed of single-crystal silicon is preferably used as the substrate 100. Voltage for reading a signal charge is applied to each gate electrode 103. Polysilicon (polycrystal silicon) is preferably used as the constituent material of the gate electrode 103. Such polysilicon may be doped with boron (B). Although not shown in the figure, the gate insulating film is, as described above, formed between the substrate 100 and each gate electrode 103 in FIG. 2. Moreover, an insulating sidewall may be formed on a side surface of the gate electrode 103.

The charge accumulation part 102 formed in the substrate 100 is the region where a signal charge photogenerated by the photoelectric conversion layer 111 is accumulated, and the charge reading part 104 is the region where a charge read by voltage application to the gate electrode 103 is read out to the peripheral circuit region 1b. In the case where a signal charge (mainly holes in the case of the organic solid-state imaging device) is taken out from each pixel electrode 107, the charge accumulation parts 102 are formed by, e.g., ion implantation. Although not shown in FIG. 2, p-type diffusion layers or n-type diffusion layers such as wells are formed in addition to the charge accumulation parts 102. Moreover, transistors, contacts, interconnections, etc. which form the circuit capable of outputting a read signal charge (signal voltage) to the outside are formed.

The interconnection 105, the metal contact 106, the upper contact 109, and the contact plug 200 function as the path for transferring a signal charge from the pixel electrode 107 to the charge accumulation part 102 and transmitting signal voltage from the pixel electrode 107 to the charge accumulation part 102. Tungsten (W) is preferably used as the material of the metal contact 106 connected to the charge accumulation part 102 and the gate electrode 103. Aluminum (Al) is preferably used as the material of the upper contact 109 connected to the pixel electrode 107. Moreover, polysilicon is preferably used as the material of the contact plug 200, and such polysilicon may be doped with boron (B) or phosphorus (P).

The interconnection 105 is not limited to a single-layer structure, and may have the structure of two or more layers. The number of interconnection layers of the interconnection 105 can be optionally set depending on circuits.

Aluminum (Al) is preferably used for the pixel electrode 107. For example, aluminum is applied on the interlayer insulating layer 101 by, e.g., sputtering, and a resist film having a desired electrode pattern is formed on the applied aluminum. Subsequently, a desired pixel electrode 107 can be formed by dry etching using the resist film as a mask. The foregoing configuration can be easily achieved by adjustment of the conditions of a well-known process, i.e., a so-called CMOS process.

Using flash evaporation, the photoelectric conversion layer 111 formed on the pixel electrodes 107 is formed of, e.g., a mixed layer of copper phthalocyanine and fullerene having a broad absorption band in a visible range. The photoelectric conversion layer 111 absorbs light having transmitted through each color filter 112, and generates a charge by photoelectric conversion. The counter electrode 108 formed on the photoelectric conversion layer 111 is formed by, e.g., vacuum deposition. Since incident light to be a signal enters the photoelectric conversion layer 111 through the counter electrode 108, ITO having high light transmittance is preferably used for the counter electrode 108.

Each color filter 112 formed on the counter electrode 108 is a filter having a transparent wavelength corresponding to one of the imaging pixels 10. The top lens 114 is formed on each color filter 112.

(3) Method for Manufacturing Contact Plug in Solid-State Imaging Device

The steps which are the characteristics of the process in manufacturing the contact plug 200 made of semiconductor and including the selectively-silicided upper part will be described below with reference to FIGS. 3 to 8. Note that FIGS. 3 to 8 illustrate a main part in formation of the contact plug 200.

Figure 3:
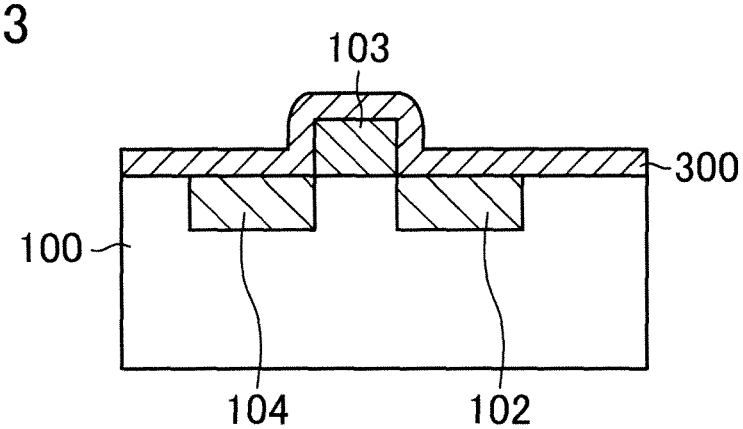
FIG. 3 is a schematic cross-sectional view illustrating one step in the method for manufacturing the solid-state imaging device of the first embodiment.

First, referring to FIG. 3, e.g., a gate insulating film (not shown in the figure) made of silicon oxide and a gate electrode 103 made of polysilicon are selectively formed on a principal surface of a substrate 100. Subsequently, diffusion regions including a charge accumulation part 102 and a charge reading part 104 are, by ion implantation, formed in an upper part of the substrate 100 by using a desired resist pattern and the gate electrode 103 as a mask. Note that a sidewall may be formed on a side surface of the gate electrode 103. In this case, ion implantation is, depending on device characteristics etc., performed before formation of the sidewall, after formation of the sidewall, or both of before and after formation of the sidewall. Subsequently, an insulating film 300 made of, e.g., silicon oxide is, by, e.g., CVD, formed on the entirety of an upper surface of the substrate 100 so as to cover the charge accumulation part 102, the gate electrode 103, and the charge reading part 104.

Figure 4:
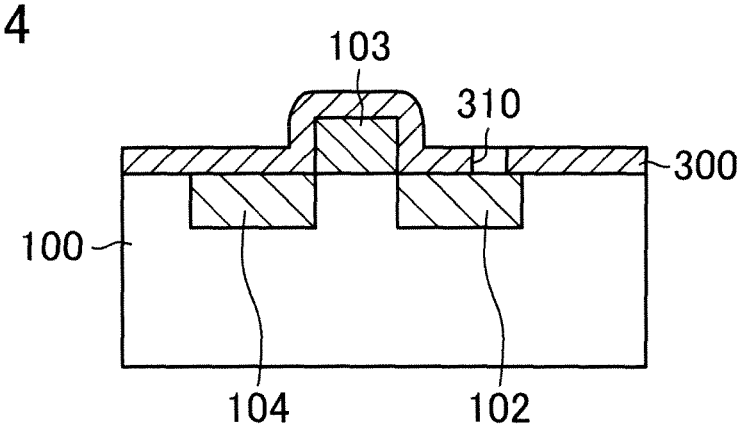
FIG. 4 is a schematic cross-sectional view illustrating another step in the method for manufacturing the solid-state imaging device of the first embodiment.

Next, referring to FIG. 4, a hole 310 through which the charge accumulation part 102 is exposed is, by typical lithography and etching processes, formed in part of the insulating film 300 above the charge accumulation part 102.

Figure 5:
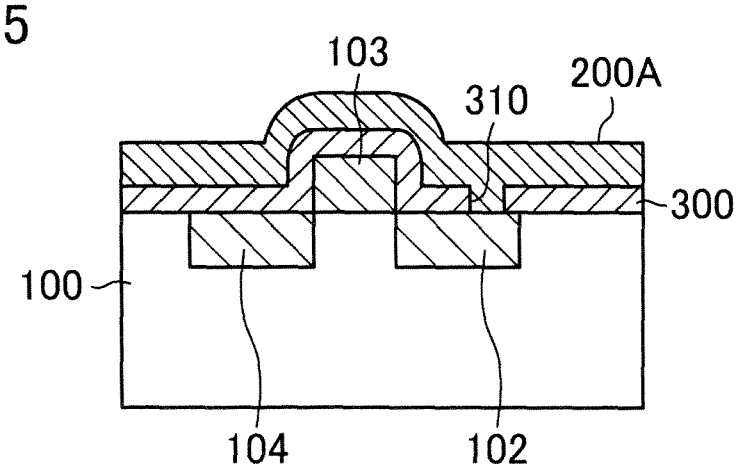
FIG. 5 is a schematic cross-sectional view illustrating still another step in the method for manufacturing the solid-state imaging device of the first embodiment.

Next, referring to FIG. 5, a semiconductor film 200A made of, e.g., polysilicon is, by, e.g., CVD, formed on the insulating film 300 provided with the hole 310 so as to fill the hole 310.

Next, referring to FIG. 6, e.g., dry etching is performed for the region of the semiconductor film 200A other than the part to be a contact plug 200, thereby forming the contact plug 200 from the semiconductor film 200A. The part to be the contact plug 200 includes a lower part formed from the semiconductor film 200A and embedded in the hole 310 formed in the insulating film 300, and an upper part extending over a peripheral edge part of the hole 310 formed in the insulating film 300. Thus, the contact plug 200 is in a substantially T-shape in a cross section perpendicular to a substrate surface. Note that part of the insulating film 300 below the region from which the semiconductor film 200A is removed by etching, i.e., part of the insulating film 300 in the region where no contact plug 200 is to be formed is not completely removed, and at least part of such an insulating film part in a thickness direction remains. Preferably, part of the insulating film 300 below the region from which the semiconductor film 200A is etched has a thickness of equal to or greater than about 20 nm and equal to or less than about 60 nm.

Subsequently, although not shown in the figure, part of the insulating film 300 formed on gate electrodes, sources, drains, etc. on which silicide is to be formed is removed from the peripheral circuit region 1b illustrated in FIG. 1 by, e.g., etching before silicidation.

Next, referring to FIG. 7, silicide 210 is selectively, i.e., self-alignedly, formed on part of the semiconductor contact plug 200 exposed through the insulating film 300, using the insulating film 300 as a silicide block layer. At this point, the insulating film 300 remains as the silicide block layer on the charge reading part 104 and the gate electrode 103 in the region other than the connection part between the charge accumulation part 102 and the contact plug 200. Thus, no silicide 210 is formed on the charge accumulation part 102, the charge reading part 104, and the gate electrode 103. Moreover, although not shown in the figure, silicide 210 is, in the peripheral circuit region 1b illustrated in FIG. 1, formed on diffusion regions such as the sources and the drains and the gate electrodes in the region from which the insulating film 300 is removed.

As just described, the silicide 210 is formed on part of the semiconductor contact plug 200 positioned above the insulating film 300. Thus, it can be ensured that the contact plug 200 made of semiconductor and including the selectively-silicided upper part is formed.

Next, referring to FIG. 8, after the contact plug 200 made of semiconductor and including the selectively-silicided upper part is formed, an interlayer insulating layer 101 is formed, followed by forming metal contacts 106, interconnections 105, and upper contacts 109 in this order in the interlayer insulating layer 101. A hole 320 formed in the insulating film 300 and serving as the connection part between the gate electrode 103 and the metal contact 106 is formed at the same time as holes for forming the metal contacts 106 above the diffusion region 102 and the gate electrode 103 are formed. In this case, the interlayer insulating layer 101 contains, e.g., silicon oxide as a main component. The interlayer insulating layer 101 includes a first layer in which the plurality of metal contacts 106 are formed, a second layer in which the plurality of interconnections 105 are formed, and a third layer in which the plurality of upper contacts 109 are formed. Each of the first, second, and third layers of the interlayer insulating layer 101 may be formed such that a plurality of insulating films are stacked on each other.

In the present embodiment, the configuration is employed, in which the contact plug 200 made of semiconductor and including the selectively-silicided upper part is provided only between the charge accumulation part 102 and the metal contact 106. However, a contact plug made of semiconductor and including a selectively-silicided upper part may be also provided between the gate electrode 103 and the metal contact 106. Moreover, in a diffusion region other than the charge accumulation part 102, a contact plug made of semiconductor and including a selectively-silicided upper part may be also provided.

The foregoing process may be a well-known process, i.e., a so-called CMOS process, whose conditions are suitably adjusted. The configuration which is not shown in the figure may be also suitably achieved by adjustment of the conditions of the well-known process, i.e., the so-called CMOS process. Moreover, the photoelectric conversion layer 111 may be formed by vacuum deposition such as flash evaporation.

In the foregoing manufacturing method, the solid-state imaging device 1 of the first embodiment can be manufactured.

Second Embodiment

A solid-state imaging device of a second embodiment is a solid-state imaging device configured such that photodiodes are formed in a semiconductor substrate. Unlike the solid-state imaging device of the first embodiment, the solid-state imaging device of the present embodiment is configured such that, in the imaging pixel region 1a illustrated in FIG. 1, not only contact plugs 200 each contacting a corresponding one of charge accumulation parts 102 but also, e.g., contact plugs each contacting a corresponding one of charge reading parts, sources, drains, and gate electrodes are contact plugs 200 made of semiconductor and including selectively-silicided upper parts.

The solid-state imaging device of the second embodiment will be described with reference to FIG. 9. Note that the same reference numerals as those shown in the solid-state imaging device of the first embodiment illustrated in FIG. 2 are used to represent equivalent elements in FIG. 9, and the description thereof will not be repeated.

Figure 9:
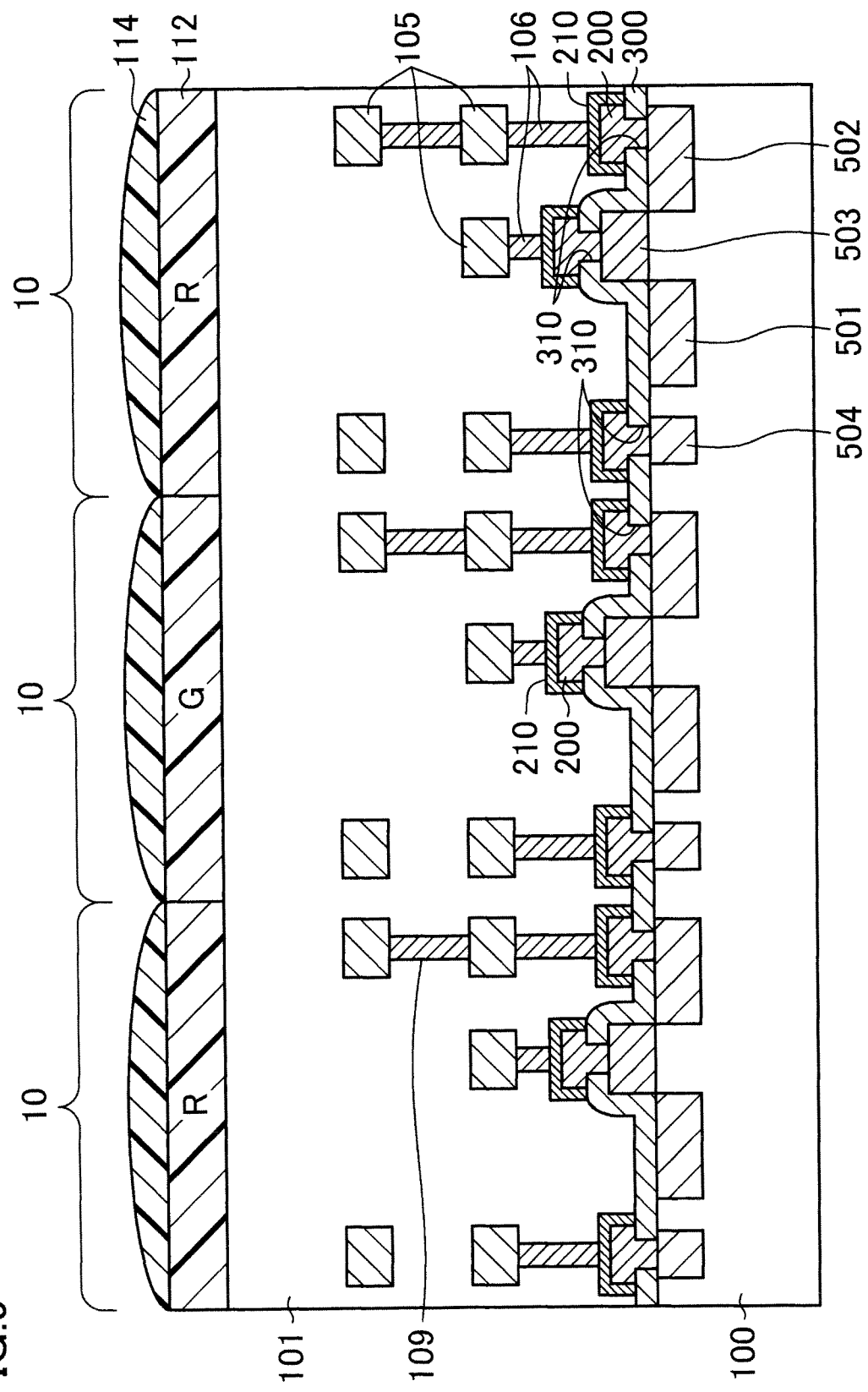
FIG. 9 is a schematic cross-sectional view illustrating part of an imaging pixel region in a solid-state imaging device of a second embodiment.

Referring to FIG. 9, e.g., the following diffusion regions are formed in an upper part of a substrate 100: photodiodes 501 each capable of generating a signal charge by photoelectric conversion; charge reading parts 502 each capable of reading a signal charge from a corresponding one of the photodiodes 501; and sources/drains 504 forming transistors. In each region between the photodiode 501 and the charge reading part 502, a gate electrode 503 is provided on a principal surface of the substrate 100 with a gate insulating film (not shown in the figure) being interposed between the gate electrodes 503 and the substrate 100. Each source/drain 504 forming the transistor is disposed apart from the photodiode 501 with a predetermined distance. An insulating film 300 is formed on the photodiodes 501, the charge reading parts 502, the sources/drains 504, and the gate electrodes 503, except for connection parts with the contact plugs 200. The plurality of contact plugs 200 made of semiconductor and each connected to a corresponding one of the charge reading parts 502, the sources/drains 504, and the gate electrodes 503 through a corresponding one of holes 310 penetrating the insulating film 300 are formed on the charge reading parts 502, the sources/drains 504, and the gate electrodes 503. Each contact plug 200 has such a T-shaped cross section that a lower part thereof is embedded in the hole 310 formed in the insulating film 300 and that an upper lateral part thereof extends over a peripheral edge part of the hole 310.

Silicide 210 containing Co, Ni, or Pt is formed on part of each semiconductor contact plug 200 exposed through the insulating film 300, i.e., on an upper part of the contact plug 200. In other words, no silicide is formed on the lower part of the contact plug 200 embedded in the insulating film 300, and the silicide 210 is formed on the upper part of the contact plug 200 exposed through the insulating film 300.

The semiconductor material forming the contact plug 200 is, e.g., boron-doped (B-doped) polysilicon, and the transistor including the source/drain 504 is, e.g., a pMOS transistor.

Metal contacts 106, lower interconnections 105, upper contacts 109, and upper interconnections 105 are, in addition to the contact plugs 200, formed in an interlayer insulating layer 101. Each contact plug 200 is connected to a corresponding one of the lower interconnections 105 through a corresponding one of the metal contacts 106 connected to the upper parts of the contact plugs 200. The lower interconnection 105 is selectively connected to the upper interconnection 105 through the upper contact 109 formed on the lower interconnection 105. Although FIG. 9 illustrates the case where there are two layers of the interconnections 105, the present disclosure is not limited to such a case. The number of layers of the interconnections 105 may be optionally set depending on circuits. Color filters 112 are formed on the interlayer insulating layer 101. A top lens 114 is formed on each color filter 112. Incident light is collected by the top lenses 114, and enters the photodiodes 501 through the color filters 112 and the interlayer insulating layer 101.

In the method for manufacturing the contact plug 200 which is made of semiconductor and which includes the selectively-silicided upper part, each hole 310 is formed in a predetermined region of the insulating film 300 formed on the charge reading parts 502, the gate electrodes 503, and the sources/drains 504. The subsequent steps are performed by the method described in the first embodiment.

In the first embodiment, each contact plug 200 made of semiconductor and including the selectively-silicided upper part is formed only on the charge accumulation part 102. However, in the second embodiment, each contact plug 200 is formed on a desired region of the charge reading part 502, the source/drain 504, or the gate electrode 503.

Although not shown in the figure, a gate insulating film is also formed between the substrate 100 and the gate electrode 503 in FIG. 9. Moreover, a sidewall may be formed on a side surface of the gate electrode 503.

The foregoing process may be a well-known process, i.e., a so-called CMOS process, whose conditions are suitably adjusted.

In the foregoing manufacturing method, the solid-state imaging device of the second embodiment can be manufactured.

First Variation of First Embodiment

Figure 10:
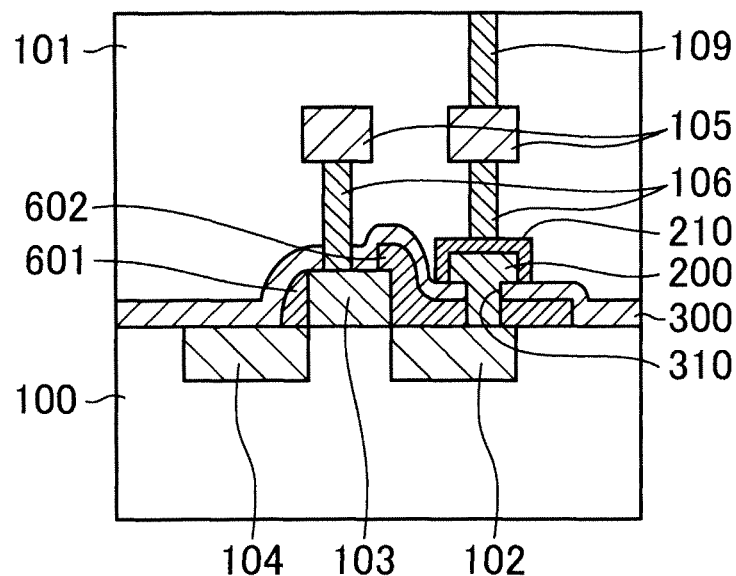
FIG. 10 is a schematic cross-sectional view illustrating part of an imaging pixel region in a solid-state imaging device of a first variation of the first embodiment.

A solid-state imaging device of a first variation of the first embodiment will be described with reference to FIG. 10. Note that FIG. 10 illustrates a main part of the solid-state imaging device. Moreover, the same reference numerals as those shown in the solid-state imaging device of the first embodiment illustrated in FIG. 2 are used to represent equivalent elements in FIG. 10, and the description thereof will not be repeated. The same applies to other variations.

Referring to FIG. 10, the solid-state imaging device of the first variation includes, as an insulating film covering a charge accumulation part 102, a second insulating film 602 covering the charge accumulation part 102, and an insulating film 300 (referred to as a "first insulating film 300" in the present variation) formed on the second insulating film 602. A sidewall 601 having the same composition as that of the second insulating film 602 and formed by the same steps as those of the second insulating film 602 is provided on a side surface of a gate electrode 103 close to a charge reading part 104. In this case, e.g., silicon oxide or silicon nitride may be used for the sidewall 601 and the second insulating film 602.

The main part of the solid-state imaging device of the present variation and the method for manufacturing the solid-state imaging device of the present variation will be described below.

First, e.g., a gate insulating film (not shown in the figure) made of silicon oxide and a gate electrode 103 made of polysilicon are selectively formed on a principal surface of a substrate 100. Subsequently, diffusion regions including a charge accumulation part 102 and a charge reading part 104 are, by ion implantation, formed in an upper part of the substrate 100 by using a desired resist pattern and the gate electrode 103 as a mask.

Next, an insulating sidewall formation film is formed on the substrate 100 so as to cover the charge accumulation part 102, the charge reading part 104, and the gate electrode 103. Subsequently, lithography is performed to mask part of the sidewall formation film above the charge accumulation part 102 by a resist pattern. Using the resist pattern as a mask, the sidewall formation film is etched back by, e.g., dry etching, thereby forming, from the sidewall formation film, a sidewall 601 covering a side surface of the gate electrode 103 close to the charge reading part 104. At the same time, a second insulating film 602 covering a side surface of the gate electrode 103 close to the charge accumulation part 102 and covering the charge accumulation part 102 is formed from the sidewall formation film. Since part of the second insulating film 602 formed on the charge accumulation part 102 which is the diffusion region is not removed, no damage due to etching in sidewall formation is caused in the charge accumulation part 102. As a result, noise can be further reduced.

Next, a first insulating film 300 is formed on the substrate 100 so as to cover the second insulating film 602, the charge reading part 104, and the gate electrode 103 including the sidewall 601. Subsequently, a hole 310 which penetrates part of the first insulating film 300 above the charge accumulation part 102 and part of the second insulating film 602 above the charge accumulation part 102 and through which the charge accumulation part 102 is exposed is formed by lithography and dry etching. Then, a semiconductor film made of polysilicon is formed on the first insulating film 300 across the entirety of an upper surface of the substrate 100 so as to fill the hole 310.

Next, e.g., dry etching is performed for the region of the semiconductor film other than the part to be a contact plug 200, thereby forming the contact plug 200 made of semiconductor. The part to be the contact plug 200 includes part of the semiconductor film embedded in the hole 310, and part of the first insulating film 300 above a peripheral edge part of the hole 310. As just described, since the contact plug 200 is, at a lower part thereof, embedded in the first insulating film 300 and the second insulating film 602, and extends, at an upper lateral part thereof, over the peripheral edge part of the hole 310, the contact plug 200 is in a substantially T-shape in a cross section perpendicular to a substrate surface. Note that part of the first insulating film 300 below the region from which the semiconductor film is removed by etching, i.e., part of the first insulating film 300 in the region where no contact plug 200 is to be formed is not completely removed, and at least part of such an insulating film part in a thickness direction remains. Preferably, part of the first insulating film 300 below the region from which the semiconductor film is etched has a thickness of equal to or greater than about 20 nm and equal to or less than about 60 nm.

Although not shown in the figure, part of the first insulating film 300 formed on gate electrodes, sources, drains, etc. in the peripheral circuit region 1b illustrated in FIG. 1 is removed by, e.g., etching before silicidation.

Next, in the imaging pixel region 1a illustrated in FIG. 1, silicide 210 is selectively formed on part of the semiconductor contact plug 200 exposed through the first insulating film 300, using the first insulating film 300 as a silicide block layer. At this point, the first insulating film 300 remains as the silicide block layer on the charge reading part 104 and the gate electrode 103 in the region other than the connection part between the charge accumulation part 102 and the contact plug 200. Thus, no silicide 210 is formed on the charge accumulation part 102, the charge reading part 104, and the gate electrode 103. Moreover, although not shown in the figure, silicide 210 is, in the peripheral circuit region 1b illustrated in FIG. 1, formed on diffusion regions such as the sources and the drains and the gate electrodes in the region from which the first insulating film 300 is removed.

As just described, silicide is formed on part of the semiconductor contact plug 200 positioned above the first insulating film 300. Thus, it can be ensured that the contact plug 200 made of semiconductor and including the selectively-silicided upper part is formed.

Next, after the contact plug 200 made of semiconductor and including the selectively-silicided upper part is formed, an interlayer insulating layer 101 is formed, followed by forming metal contacts 106, interconnections 105, and an upper contact 109 in this order in the interlayer insulating layer 101.

Then, although not shown in the figure, pixel electrodes, a photoelectric conversion layer, a counter electrode, color filters, and top lenses are formed in this order as in the first embodiment.

In the case where only the metal contact 106 is used as a contact for the charge accumulation part 102, dry etching for forming the metal contact 106 should cause the metal contact 106 to penetrate the interlayer insulating layer 101, the first insulating film 300, and the second insulating film 602. In the case where the interlayer insulating layer 101 is made of an insulating material containing silicon oxide as a main component, and the second insulating film 602 is made of an insulating material containing silicon nitride as a main component, the materials having different compositions are etched, resulting in a difficult process. However, if the contact plug 200 made of semiconductor is formed in advance as in the present disclosure, the charge accumulation part 102 and the metal contact 106 are electrically connected together through the contact plug 200. Thus, etching for forming the metal contact 106 only causes the metal contact 106 to penetrate the interlayer insulating layer 101, resulting in a simple process.

Moreover, since the second insulating film 602, the first insulating film 300, and the contact plug 200 are provided on the charge accumulation part 102, the distance between the principal surface of the substrate 100 and an upper surface of the contact plug 200 is, in each imaging pixel 10, greater than the distance between the principal surface of the substrate 100 and an upper surface of the charge reading part 104 and the distance between the principal surface of the substrate 100 and an upper surface of the gate electrode 103. Thus, since the thickness of the interlayer insulating layer 101 becomes smaller in part of the interlayer insulating layer 101 above the contact plug 200 in dry etching for forming the metal contact 106, the amount of etching of the interlayer insulating layer 101 decreases. As a result, there is a possibility to expose the contact plug 200 due to over-etching thereof. However, the silicide 210 is formed on the contact plug 200, and the etching selectivity of the interlayer insulating layer 101 to silicide typically made of metal such as cobalt (Co), nickel (Ni), or platinum (Pt) in etching for forming the metal contact 106 is high. Thus, it is less likely that the silicide is removed.

Thus, since the contact plug 200 made of semiconductor and including the silicided part is formed in the solid-state imaging device of the present variation, the solid-state imaging device can be manufactured by a simple process.

Referring to FIG. 10, the sidewall 601 and the second insulating film 602 are, in the present variation, formed from the sidewall formation film having a certain composition and formed by a single film formation step, but the present disclosure is not limited to the foregoing. For example, the sidewall formation film may be formed of at least two layers. In this case, the number of layers forming the second insulating film 602 may be less than the number of layers forming the sidewall 601. For example, the layers forming the sidewall formation film may be a first silicon oxide film, a second silicon oxide film, and a silicon nitride film formed in this order from the gate electrode 103, and the layer forming the second insulating film 602 may be the first silicon oxide film. In this case, the sidewall 601 and the second insulating film 602 cannot be formed by a single film formation step.

The foregoing process may be a well-known process, i.e., a so-called CMOS process, whose conditions are suitably adjusted The configuration which is not shown in the figure may be also suitably achieved by adjustment of the conditions of the well-known process, i.e., the so-called CMOS process.

In the foregoing manufacturing method, the solid-state imaging device of the present variation can be manufactured.

The configuration of the present variation is also applicable to the solid-state imaging device of the second embodiment.

Second Variation of First Embodiment

A solid-state imaging device of a second variation of the first embodiment will be described with reference to FIG. 11. Note that FIG. 11 illustrates a main part of the solid-state imaging device.

Figure 11:
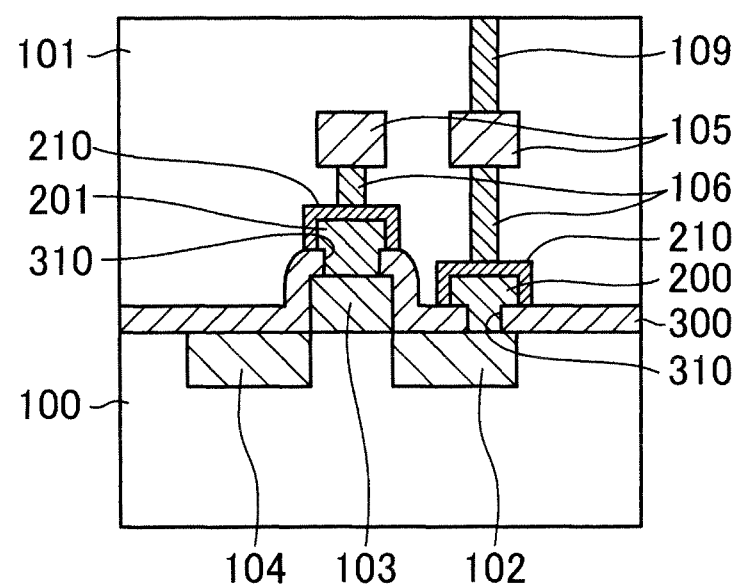
FIG. 11 is a schematic cross-sectional view illustrating part of an imaging pixel region in a solid-state imaging device of a second variation of the first embodiment.

Referring to FIG. 11, the solid-state imaging device of the second variation includes, as in the second embodiment, a contact plug 201 formed between a gate electrode 103 and a metal contact 106, made of semiconductor, and including a selectively-silicided upper part. A contact diameter is larger in a bottom part of the contact plug 201 than in a bottom part of a contact plug 200 connected to a charge accumulation part 102.

The main part of the solid-state imaging device of the present variation and the method for manufacturing the solid-state imaging device of the present variation will be described below.

First, e.g., a gate insulating film (not shown in the figure) made of silicon oxide and a gate electrode 103 made of polysilicon are selectively formed on a principal surface of a substrate 100. Subsequently, diffusion regions including a charge accumulation part 102 and a charge reading part 104 are, by ion implantation, formed in an upper part of the substrate 100 by using a desired resist pattern and the gate electrode 103 as a mask.

Next, an insulating film 300 is formed on the substrate 100 so as to cover the charge reading part 104, the gate electrode 103, and the charge accumulation part 102. Subsequently, holes 310 which respectively penetrate part of the insulating film 300 above the charge accumulation part 102 and part of the insulating film 300 above the gate electrode 103 and through each of which a corresponding one of the charge accumulation part 102 and the gate electrode 103 is exposed are formed by lithography and dry etching. The holes 310 are formed such that the lower opening diameter of the hole 310 formed above the gate electrode 103 is greater than that of the hole 310 formed above the charge accumulation part 102. That is, the lower opening area of the hole 310 formed above the gate electrode 103 is greater than that of the hole 310 formed above the charge accumulation part 102. Subsequently, a semiconductor film made of polysilicon is formed on the insulating film 300 across the entirety of an upper surface of the substrate 100 so as to fill the holes 310.

Next, e.g., dry etching is performed for the region of the semiconductor film other than the part to be contact plugs 200, 201, thereby forming the contact plugs 200, 201 made of semiconductor. The part to be the contact plugs 200, 201 each include part of the semiconductor film embedded in the hole 310, and part of the insulating film 300 on a peripheral edge part of the hole 310. As just described, since each of the contact plugs 200, 201 is, at a lower part thereof, embedded in the insulating film 300, and extends, at an upper lateral part thereof, over the peripheral edge part of the hole 310, each of the contact plugs 200, 201 is in a substantially T-shape in a cross section perpendicular to a substrate surface.

Since the opening diameter of the hole 310 formed above the gate electrode 103 in the insulating film 300 is greater than that of the hole 310 formed above the charge accumulation part 102 in the insulating film 300, a bottom surface of the contact plug 201 formed on the gate electrode 103 is larger than that of the contact plug 200 formed on the charge accumulation part 102. Note that part of the insulating film 300 below the region from which the semiconductor film is removed by etching, i.e., part of the insulating film 300 in the region where no contact plugs 200, 201 are formed is not completely removed, and at least part of such an insulating film part in a thickness direction remains. Preferably, part of the insulating film 300 below the region from which the semiconductor film is etched has a thickness of equal to or greater than about 20 nm and equal to or less than about 60 nm.

Although not shown in the figure, part of the insulating film 300 formed on gate electrodes, sources, drains, etc. on which silicide is to be formed is removed from the peripheral circuit region 1b illustrated in FIG. 1 by, e.g., etching before silicidation.

Next, in the imaging pixel region 1a illustrated in FIG. 1, silicide 210 is selectively formed on part of the semiconductor contact plugs 200, 201 exposed through the insulating film 300, using the insulating film 300 as a silicide block layer. At this point, the insulating film 300 remains as the silicide block layer in the region other than the connection part between the charge accumulation part 102 and the contact plug 200, the charge reading part 104, and the connection part between the gate electrode 103 and the contact plug 201. Thus, no silicide 210 is formed on the charge accumulation part 102, the charge reading part 104, and the gate electrode 103. Moreover, although not shown in the figure, silicide 210 is, in the peripheral circuit region 1b illustrated in FIG. 1, formed on diffusion regions such as the sources and the drains and the gate electrodes in the region from which the insulating film 300 is removed.

As just described, the silicide 210 is formed on part of the semiconductor contact plugs 200, 201 positioned above the insulating film 300. Thus, it can be ensured that the contact plugs 200, 201 each made of semiconductor and including the selectively-silicided upper part are formed.

Next, after the contact plugs 200, 201 made of semiconductor and including the selectively-silicided upper parts are formed, an interlayer insulating layer 101 is formed, followed by forming metal contacts 106, interconnections 105, and an upper contact 109 in this order in the interlayer insulating layer 101.

Then, although not shown in the figure, pixel electrodes, a photoelectric conversion layer, a counter electrode, color filters, and top lenses are formed in this order as in the first embodiment.

In the solid-state imaging device of the present variation, the contact area between the gate electrode 103 and the contact plug 201 made of semiconductor is greater than the contact area between the charge accumulation part 102 and the contact plug 200 made of semiconductor. Thus, the contact resistance between the gate electrode 103 and the contact plug 201 made of semiconductor can be reduced.

The foregoing process may be a well-known process, i.e., a so-called CMOS process, whose conditions are suitably adjusted. The configuration which is not shown in the figure may be also suitably achieved by adjustment of the conditions of the well-known process, i.e., the so-called CMOS process.

In the foregoing manufacturing method, the solid-state imaging device of the second variation can be manufactured.

The configuration of the present variation is also applicable to the solid-state imaging device of the second embodiment.

Third Variation of First Embodiment

A solid-state imaging device of a third variation of the first embodiment will be described with reference to FIGS. 12A to 12D. Note that FIGS. 12A to 12D illustrate a main part of the solid-state imaging device.

Figure 12A:
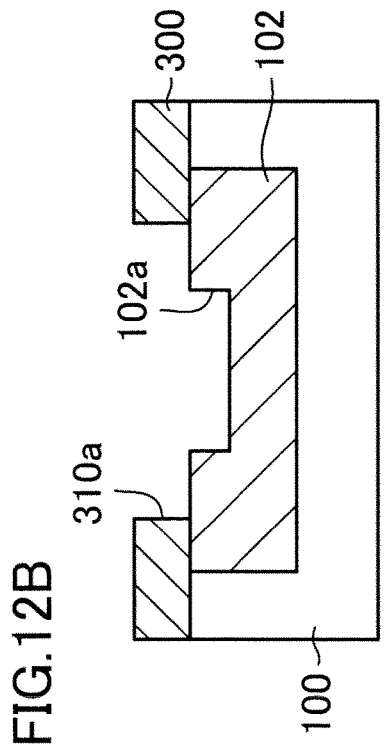
FIGS. 12A to 12D are cross-sectional views sequentially illustrating steps in the method for manufacturing a main part of a solid-state imaging device of a third variation of the first embodiment.
Figure 12B:
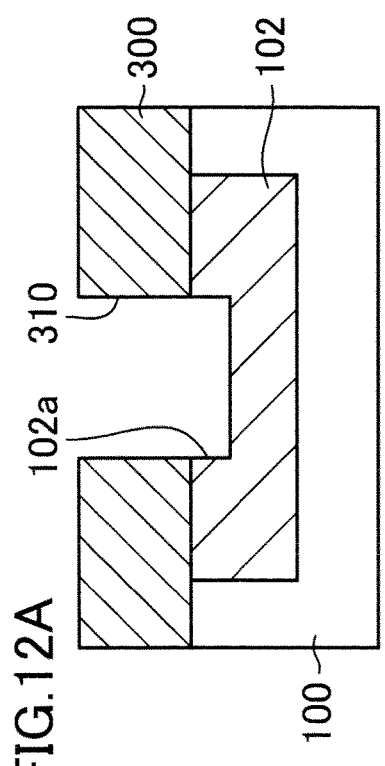
Figure 12C:
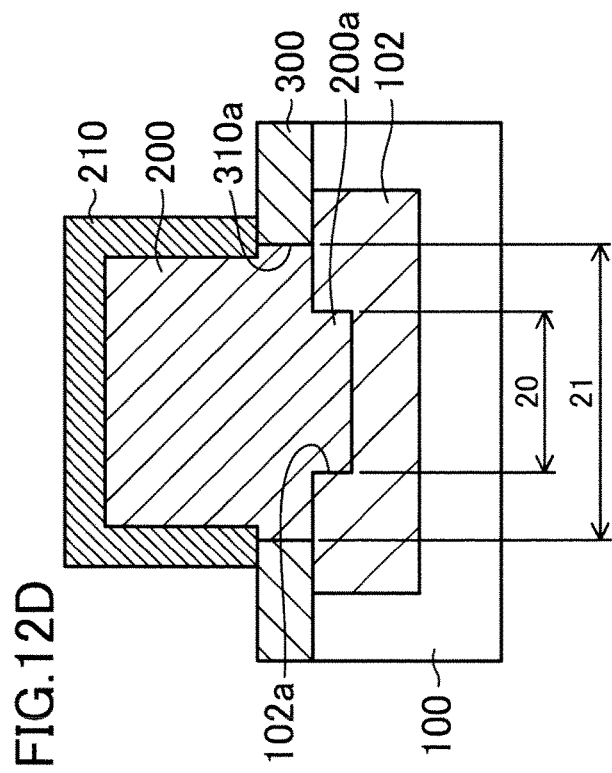
Figure 12D:
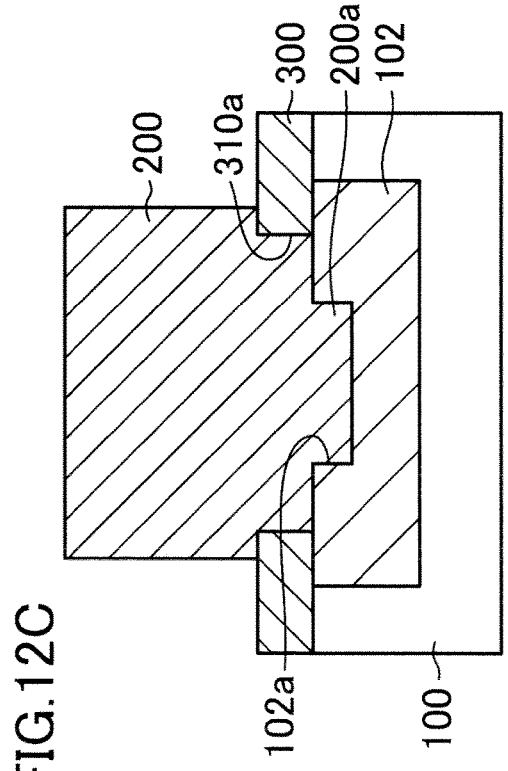

Referring to FIG. 12D, in the solid-state imaging device of the third variation, a raised part 200a protruding downward is provided at a center bottom part of a contact plug 200 contacting a charge accumulation part 102 and made of semiconductor.

The main part of the solid-state imaging device of the present variation and the method for manufacturing the solid-state imaging device of the present variation will be described below.

First, referring to FIG. 12A, a charge accumulation part 102 which is a diffusion region is selectively formed in an upper part of a substrate 100.

Subsequently, an insulating film 300 is formed on the charge accumulation part 102. Then, a hole 310 penetrating the insulating film 300 is formed by, e.g., etching. Such etching hollows out the upper part of the substrate 100, i.e., part of the charge accumulation part 102 below the hole 310, thereby forming a hollowed part 102a.

Next, referring to FIG. 12B, etching for increasing the opening diameter of the hole 310 is performed for the insulating film 300, thereby forming another hole 310a. In this case, e.g., wet etching using a detergent solution is performed to isotropically etch the insulating film 300. This can form the hole 310a having the increased opening diameter of the hole 310, and therefore the hollowed part 102a is positioned at the center on a lower side of the hole 310.

Next, referring to FIG. 12C, a semiconductor film made of polysilicon is formed on the insulating film 300 in which the hole 310a is formed. Subsequently, e.g., dry etching is performed for the region of the semiconductor film other than the part to be a contact plug 200, thereby forming the contact plug 200 made of semiconductor. The part to be the contact plug 200 includes part of the semiconductor film embedded in the hole 310a and the hollowed part 102a of the charge accumulation part 102, and an upper part positioned at a peripheral edge part of the hole 310a formed in the insulating film 300. Thus, the contact plug 200 is in a stepped shape having a step at the bottom thereof. Note that part of the insulating film 300 below the region from which the semiconductor film is removed by etching, i.e., part of the insulating film 300 in the region where no contact plug 200 is formed is not completely removed, and at least part of such an insulating film part in a thickness direction remains. Preferably, part of the insulating film 300 below the region from which the semiconductor film is etched has a thickness of equal to or greater than about 20 nm and equal to or less than about 60 nm.

Next, referring to FIG. 12D, silicide 210 is selectively formed on part of the semiconductor contact plug 200 exposed through the insulating film 300, using the insulating film 300 as a silicide block layer. At this point, the insulating film 300 remains as the silicide block layer in the region other than the connection part between the charge accumulation part 102 and the contact plug 200. Thus, no silicide 210 is formed on the charge accumulation part 102. On the other hand, the silicide 210 is formed on part of the semiconductor contact plug 200 positioned above the insulating film 300.

As just described, it can be ensured that the contact plug 200 made of semiconductor and including the selectively-silicided upper part is formed.

Then, although not shown in the figure, an interlayer insulating layer is formed as in the first embodiment, followed by forming metal contacts, interconnections, and an upper contact in this order in the interlayer insulating layer. Subsequently, pixel electrodes, a photoelectric conversion layer, a counter electrode, color filters, and top lenses are formed on the interlayer insulating film in this order.

In the solid-state imaging device of the present variation, the diameter 20 of the hollowed part 102a influencing damage on the substrate 100, i.e., the charge accumulation part 102 which is the diffusion region, due to dry etching is less than the opening diameter 21 of the hole 310a of the insulating film 300. Thus, damage on the charge accumulation part 102 is reduced, resulting in noise reduction.

Conversely, the opening diameter 1 of the hole 310a determining the contact area between the charge accumulation part 102 and the contact plug 200 is greater than the diameter 20 corresponding to the opening diameter of the initially-formed hole 310. Thus, the contact resistance between the charge accumulation part 102 and the contact plug 200 can be significantly reduced.

The foregoing process may be a well-known process, i.e., a so-called CMOS process, whose conditions are suitably adjusted. The configuration which is not shown in the figure may be also suitably achieved by adjustment of the conditions of the well-known process, i.e., the so-called CMOS process.

In the foregoing manufacturing method, the solid-state imaging device of the third variation can be manufactured.

The configuration of the present variation is also applicable to each of the solid-state imaging devices of the first embodiment, the first and second variations of the first embodiment, and the second embodiment.

Fourth Variation of First Embodiment

A solid-state imaging device of a fourth variation of the first embodiment will be described with reference to FIG. 13. Note that FIG. 13 illustrates a main part of the solid-state imaging device.

Figure 13:
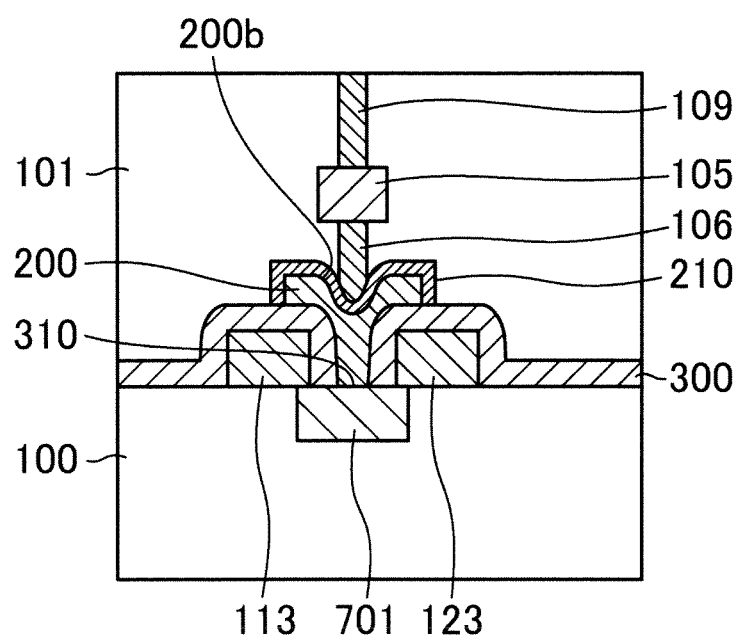
FIG. 13 is a schematic cross-sectional view illustrating part of an imaging pixel region in a solid-state imaging device of a fourth variation of the first embodiment.

Referring to FIG. 13, the solid-state imaging device of the fourth variation includes a contact plug 200 formed between two gate electrodes 113, 123 sandwiching a source/drain 701 which is a diffusion region of a transistor disposed in a pixel region. The contact plug 200 is formed so as to contact the source/drain 701 and to extend, at an upper lateral part thereof, over the gate electrodes 113, 123.

The main part of the solid-state imaging device of the present variation and the method for manufacturing the solid-state imaging device of the present variation will be described below.

First, referring to FIG. 13, e.g., a gate insulating film (not shown in the figure) made of silicon oxide and gate electrodes 113, 123 made of polysilicon are selectively formed on a principal surface of a substrate 100. Subsequently, a source/drain 701 is selectively formed in an upper part of the substrate 100 by ion implantation, using a desired resist pattern and the gate electrodes 113, 123 as a mask.

Next, an insulating film 300 is formed on the substrate 100 so as to cover the source/drain 701 and the gate electrodes 113, 123. Subsequently, a hole 310 which penetrates part of the insulating film 300 above the source/drain 701 and through which the source/drain 701 is exposed is formed by lithography and dry etching. Then, a semiconductor film made of polysilicon is formed on the insulating film 300 across the entirety of an upper surface of the substrate 100 so as to fill the hole 310.

Next, e.g., dry etching is performed for the region of the semiconductor film other than the part to be a contact plug 200, thereby forming the contact plug 200 made of semiconductor. Due to the shape of side and upper surfaces of the gate electrodes 113, 123, a recessed part 200b is formed at an upper center part of the contact plug 200 as viewed in a cross section perpendicular to a substrate surface. That is, an upper part of the contact plug 200 above the hole 310 formed between the gate electrodes 113, 123 are recessed, whereas an upper part of the contact plug 200 above each gate electrode 113, 123 is raised. As just described, the contact plug 200 of the present variation includes a lower part embedded in the hole 310 of the insulating film 300, and an upper lateral part extending over part of the insulating film 300 above the gate electrodes 113, 123. Thus, the contact plug 200 is in a substantially Y-shape in the cross section perpendicular to the substrate surface.

In the case where a sidewall is formed on each side surface of the gate electrodes 113, 123, the upper lateral part of the contact plug 200 does not necessarily extend over part of the insulating film 300 above the gate electrodes 113, 123, and may extend only over the sidewalls close to the source/drain 701. That is, as long as the upper part of the contact plug 200 extends over a stepped part formed on each side of the diffusion region such as a source/drain, such extension can form the contact plug whose upper part is recessed. In other words, even if the upper lateral part of the contact plug 200 is not positioned above the gate electrodes 113, 123, the upper lateral part of the contact plug 200 may be positioned above the sidewall formed on each side surface of the gate electrodes 113, 123 close to the source/drain 701.

Note that part of the insulating film 300 below the region from which the semiconductor film is removed by etching, i.e., part of the insulating film 300 in the region where no contact plug 200 is formed is not completely removed, and at least part of such an insulating film part in a thickness direction remains. Preferably, part of the insulating film 300 below the region from which the semiconductor film 200A is etched has a thickness of equal to or greater than about 20 nm and equal to or less than about 60 nm.

The semiconductor material forming the contact plug 200 is, e.g., boron-doped polysilicon, and the transistor including the source/drain 701 is, e.g., a pMOS transistor.

Although not shown in the figure, part of the insulating film 300 formed on the region on which silicide is to be formed is removed from the peripheral circuit region 1b illustrated in FIG. 1 by, e.g., etching before silicidation.

Next, silicide 210 is selectively formed on part of the semiconductor contact plug 200 exposed through the insulating film 300, using the insulating film 300 as a silicide block layer. At this point, the insulating film 300 and the gate electrodes 113, 123 are formed on the source/drain 701, and the insulating film 300 remains as the silicide block layer on the gate electrodes 113, 123. Thus, no silicide 210 is formed on the source/drain 701 and the gate electrodes 113, 123. Moreover, although not shown in the figure, silicide 210 is, in the peripheral circuit region 1b illustrated in FIG. 1, formed on diffusion regions such as sources and drains and gate electrodes in the region from which the insulating film 300 is removed.

As just described, the silicide 210 is formed on the upper part of the semiconductor contact plug 200 positioned above the insulating film 300. Thus, it can be ensured that the contact plug 200 made of semiconductor and including the selectively-silicided upper part is formed.

Next, after the contact plug 200 made of semiconductor and including the selectively-silicided upper part is formed, an interlayer insulating layer 101 is formed, followed by forming metal contacts 106, interconnections 105, and upper contacts 109 in this order in the interlayer insulating layer 101. A lower part of each metal contact 106 contacts the recessed part 200b of the contact plug 200 made of semiconductor and including the silicided upper part. As just described, since the metal contact 106 contacts, in the solid-state imaging device of the present variation, the recessed part 200b of the contact plug 200 formed in the Y-shape in the cross section perpendicular to the substrate surface, the contact area between the metal contact 106 and the contact plug 200 is larger than that in the case where a metal contact 106 and a contact plug 200 contact each other at a flat surface. As a result, the contact resistance between the metal contact 106 and the contact plug 200 can be reduced.

Then, although not shown in the figure, charge accumulation parts, charge reading parts, pixel electrodes, a photoelectric conversion layer, a counter electrode, color filters, and top lenses are formed in this order as in the first embodiment.

Alternatively, photodiodes, charge reading parts, color filters, and top lenses are formed in this order as in the second embodiment.

The foregoing process may be a well-known process, i.e., a so-called CMOS process, whose conditions are suitably adjusted. The configuration which is not shown in the figure may be also suitably achieved by adjustment of the conditions of the well-known process, i.e., the so-called CMOS process.

In the foregoing manufacturing method, the solid-state imaging device of the fourth variation can be manufactured.

Fifth Variation of First Embodiment

A solid-state imaging device of a fifth variation of the first embodiment will be described with reference to FIG. 14A. Note that FIG. 14A illustrates a main part of the solid-state imaging device.

Figure 14A:
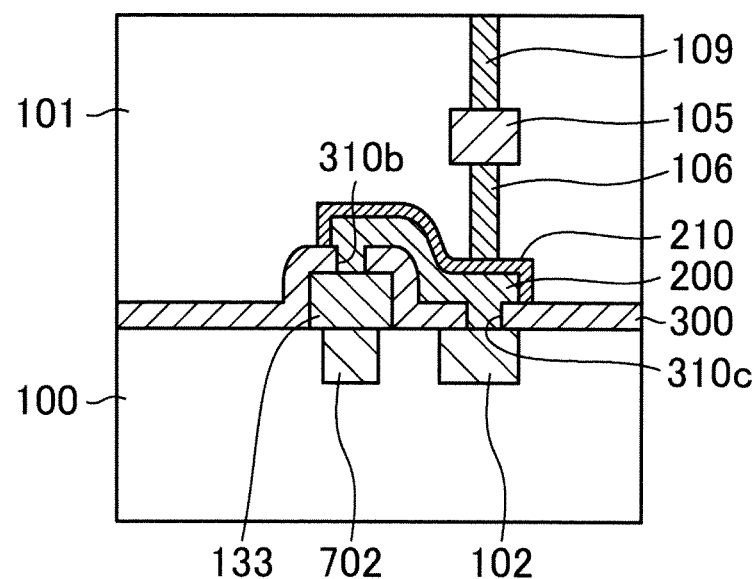
FIG. 14A is a schematic cross-sectional view illustrating part of an imaging pixel region in a solid-state imaging device of a fifth variation of the first embodiment.

Referring to FIG. 14A, the solid-state imaging device of the fifth variation includes a channel 702 and a charge accumulation part 102 which are diffusion regions formed apart from each other in an upper part of a substrate 100. A gate electrode 133 is formed on the channel 702 with a gate insulating film (not shown in the figure) being interposed between the gate electrode 133 and the channel 702. Moreover, an insulating film 300 is formed on the substrate 100 so as to cover the gate electrode 133 and the charge accumulation part 102. A contact plug 200 is formed on the insulating film 300. The contact plug 200 electrically connects the gate electrode 133 and the charge accumulation part 102 together at part of the contact plug 200 filling holes 310b, 310c penetrating the insulating film 300. Silicide 210 is formed on upper and side surfaces of part of the contact plug 200 exposed through the insulating film 300.

The main part of the solid-state imaging device of the present variation and the method for manufacturing the solid-state imaging device of the present variation will be described below.

First, referring to FIG. 14A, diffusion regions including a charge accumulation part 102 and a channel 702 are selectively formed in an upper part of a substrate 100. Subsequently, a gate electrode 133 is selectively formed on the channel 702 of the substrate 100 with a gate insulating film (not shown in the figure) being interposed between the gate electrode 133 and the channel 702.

Next, an insulating film 300 is formed on the substrate 100 so as to cover the gate electrode 133 and the charge accumulation part 102. Subsequently, holes 310b, 310c through each of which an upper part of a corresponding one of the gate electrode 133 and the charge accumulation part 102 is exposed are formed in the insulating film 300 by lithography and dry etching. Then, a semiconductor film made of polysilicon is formed on the insulating film 300 across the entirety of an upper surface of the substrate 100 so as to fill the holes 310b, 310c.

Next, e.g., dry etching is performed for the region of the semiconductor film other than the part to be a contact plug 200, thereby forming the contact plug 200 made of semiconductor. The contact plug 200 is formed so as to extend from the upper part of the gate electrode 133 to the upper part of the charge accumulation part 102. Thus, the contact plug connected to the charge accumulation part 102 and the contact plug connected to the gate electrode 133 are integrally formed from the single insulating film 300. Note that part of the insulating film 300 below the region from which the semiconductor film is removed by etching, i.e., part of the insulating film 300 in the region where no contact plug 200 is formed is not completely removed, and at least part of such an insulating film part in a thickness direction remains. Preferably, part of the insulating film 300 below the region from which the semiconductor film is etched has a thickness of equal to or greater than about 20 nm and equal to or less than about 60 nm.

The semiconductor material forming the contact plug 200 is boron-doped polysilicon, and the transistor including the channel 702 is, e.g., a pMOS transistor.

Subsequently, although not shown in the figure, part of the insulating film 300 formed on the region on which silicide is to be formed is removed from the peripheral circuit region 1b illustrated in FIG. 1 by, e.g., etching before silicidation.

Next, silicide 210 is selectively formed on part of the semiconductor contact plug 200 exposed through the insulating film 300, using the insulating film 300 as a silicide block layer. At this point, the insulating film 300 remains as the silicide block layer on the gate electrode 133 and the charge accumulation part 102. Thus, no silicide 210 is formed on the gate electrode 133 and the charge accumulation part 102. Moreover, although not shown in the figure, silicide 210 is, in the peripheral circuit region 1b illustrated in FIG. 1, formed on diffusion regions such as sources and drains and gate electrodes in the region from which the insulating film 300 is removed.

As just described, the silicide 210 is formed on the upper part of the semiconductor contact plug 200 positioned above the insulating film 300. Thus, it can be ensured that the contact plug made of semiconductor and including the selectively-silicided upper part is formed.

Next, after the contact plug 200 made of semiconductor and including the selectively-silicided upper part is formed, an interlayer insulating layer 101 is formed, followed by forming metal contacts 106, interconnections 105, and upper contacts 109 in this order in the interlayer insulating layer 101.

Then, although not shown in the figure, pixel electrodes, a photoelectric conversion layer, a counter electrode, color filters, and top lenses are formed in this order as in the first embodiment.

In the solid-state imaging device of the present variation, the gate electrode 133 and the charge accumulation part 102 are electrically connected together through the contact plug 200 made of semiconductor and including the silicided upper part.

Typically, in a solid-state imaging device, a charge accumulation part and a gate electrode of an amplifier transistor are electrically connected together. The voltage of the charge accumulation part changes depending on an accumulated signal charge. The amplifier transistor is operated in such a manner that a gate voltage thereof changes with a change in voltage of the charge accumulation part. If the gate electrode 133 is the gate electrode of the amplifier transistor, the charge accumulation part 102 and the gate electrode 133 of the amplifier transistor are directly connected together through the contact plug 200 made of semiconductor and including the silicided upper part. Thus, the contact plug 200 of the present variation can connect the gate electrode 133 and the charge accumulation part 102 together with low resistance.

Although the contact plug 200 directly connecting the gate electrode 133 and the charge accumulation part 102 together has been described, a contact plug 200 directly connecting adjacent diffusion regions together is also applicable. Such a contact plug 200 will be described as a sixth variation.

Sixth Variation of First Embodiment

The structure of the contact plug directly connecting adjacent diffusion regions together in a solid-state imaging device of the sixth variation of the first embodiment will be described with reference to FIG. 14B. Note that the gate electrode part described in the method for manufacturing the contact plug directly connecting the gate electrode and the charge accumulation part together according to the fifth variation corresponds to a diffusion region in the method for manufacturing the contact plug according to the sixth variation.

Figure 14B:
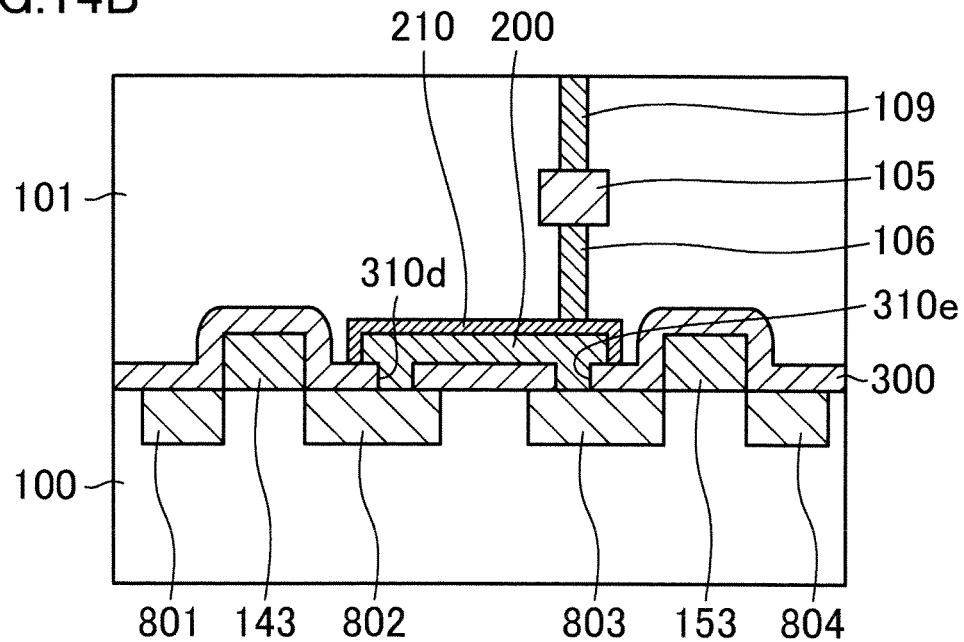
FIG. 14B is a schematic cross-sectional view illustrating part of an imaging pixel region in a solid-state imaging device of a sixth variation of the first embodiment.
Figure 15:
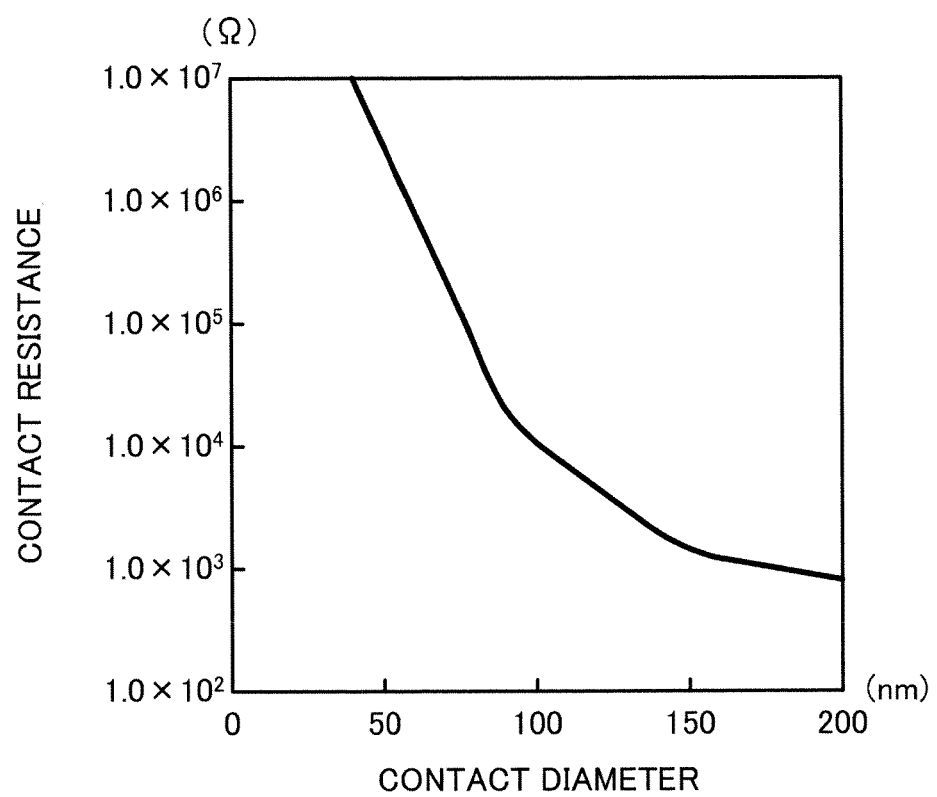
FIG. 15 is a graph showing the correlation between a contact diameter and contact resistance in a contact which is formed on a diffusion region and on which no silicide is formed.

Referring to FIG. 14B, the solid-state imaging device of the sixth variation includes source/drain regions 801, 802, 803, 804 which are diffusion regions formed apart from each other in an upper part of a substrate 100. A gate electrode 143 of an amplifier transistor is formed on the region of the substrate 100 sandwiched between the source/drain regions

801, 802 with a gate insulating film (not shown in the figure) being interposed between the gate electrode 143 and the substrate 100. A gate electrode 153 of a reset transistor is formed on the region of the substrate 100 sandwiched between the source/drain regions 803, 804 with a gate insulating film (not shown in the figure) being interposed between the gate electrode 153 and the substrate 100. Moreover, an insulating film 300 is formed on the substrate 100 so as to cover the gate electrodes 143, 153 and the source/drain regions 801, 802, 803, 804. A contact plug 200 made of semiconductor is formed on the insulating film 300. The contact plug 200 electrically connects the drain 802 of the amplifier transistor and the drain 803 of the reset transistor through part of the contact plug 200 filling holes 310*d*, 310*e* penetrating the insulating film 300. Silicide 210 is formed on upper and side surfaces of part of the contact plug 200 exposed through the insulating film 300. An interlayer insulating layer 101 is formed on the contact plug 200 and the insulating film 300, and a metal contact 106 connected to the silicided contact plug 200, an interconnection 105 connected to the metal contact 106, and an upper contact 109 connected to the interconnection 105 are formed in the interlayer insulating layer 101. Although not shown in the figure, pixel electrodes, a photoelectric conversion layer, a counter electrode, color filters, and top lenses are formed in this order as in the first embodiment.

In a typical solid-state imaging device, an accumulated charge is output to the outside through a reset transistor. Thus, a drain of the reset transistor and a drain of an amplifier transistor are electrically connected together.

In the present variation, the drain 802 of the amplifier transistor and the drain 803 of the reset transistor are directly connected together through the contact plug 200 made of semiconductor and including the silicided upper part. Thus, the contact plug 200 of the present variation can connect the drain 802 of the amplifier transistor and the drain 803 of the reset transistor with low resistance.

The foregoing process may be a well-known process, i.e., a so-called CMOS process, whose conditions are suitably adjusted. The configuration which is not shown in the figure may be also suitably achieved by adjustment of the conditions of the well-known process, i.e., the so-called CMOS process.

In the foregoing manufacturing method, the solid-state imaging devices of the fifth and sixth variations can be manufactured.

Each of the first to sixth variations described above has been described as the variation of the first embodiment. However, each variation is independently applicable in the first or second embodiment. Needless to say, various combinations of the variations are also applicable.

The solid-state imaging device of the present disclosure and the method for manufacturing the solid-state imaging device according to the present disclosure are useful for, e.g., digital still cameras or digital movie cameras including solid-state imaging devices having characteristics such as low noise and low resistance.

What is claimed is:

1. A solid-state imaging device comprising:
    an imaging pixel region where a plurality of imaging pixels are arranged on a substrate, wherein
    each imaging pixel includes
        a diffusion region formed in the substrate,
        a first gate electrode formed lateral to the diffusion region on the substrate,
        a first insulating film formed on the diffusion region and the first gate electrode,
        a first contact plug connected to the diffusion region so as to penetrate the first insulating film and made of semiconductor,
        a second contact plug connected to the first gate electrode so as to penetrate the first insulating film and made of a material identical to the semiconductor forming the first contact plug,
    the first contact plug is, at a lower part thereof, embedded in the first insulating film, and is, at an upper part thereof, exposed through the first insulating film,
    the second contact plug is, at a lower part thereof, embedded in the first insulating film, and is, at an upper part thereof, exposed through the first insulating film,
    silicide is formed on the upper part of the first contact plug and the upper part of the second contact plug,
    a solid-state imaging device further comprises a photoelectric conversion layer formed above the diffusion region, and
    the diffusion region is a charge accumulation part.

2. The solid-state imaging device of claim 1, wherein a peripheral edge part of the upper part of the first contact plug is formed so as to extend over the first insulating film.

3. The solid-state imaging device of claim 1, wherein the diffusion region forms a pMOS transistor.

4. The solid-state imaging device of claim 1, wherein the semiconductor is boron-doped polysilicon.

5. The solid-state imaging device of claim 1, further comprising:
    a sidewall formed on one of side surfaces of the first gate electrode; and
    a second insulating film formed so as to extend from the other side surface of the first gate electrode close to the diffusion region to above the diffusion region,
    wherein the second insulating film is, on the diffusion region, formed between the diffusion region and the first insulating film, and
    the first contact plug penetrates the second insulating film.

6. The solid-state imaging device of claim 5, wherein
    the sidewall is formed of a multilayer film in which at least two insulating films are stacked on each other, and
    the second insulating film is one of the insulating films forming the multilayer film.

7. The solid-state imaging device of claim 1, wherein a contact diameter of the first contact plug at the lower part thereof is smaller than that of the second contact plug at the lower part thereof.

8. The solid-state imaging device of claim 1, wherein a center bottom part of the lower part of the first contact plug is embedded in a recessed part formed in the diffusion region.

9. The solid-state imaging device of claim 1, wherein the first and second contact plugs are of unitary construction.

10. The solid-state imaging device of claim 1, further comprising:
    another diffusion region adjacent to the diffusion region;
    the first insulating film formed on the another diffusion region; and
    a third contact plug connected to the another diffusion region so as to penetrate the first insulating film,
    wherein the third contact plug is made of a material identical to the semiconductor forming the first and second contact plugs,
    the third contact plug is, at a lower part thereof, embedded in the first insulating film, and is, at an upper part thereof, exposed through the first insulating film,
    silicide is formed on the upper part of the third contact plug, and the first and third contact plugs are of unitary construction.

11. The solid-state imaging device of claim 1, further comprising:
a contact formed on the first contact plug and having conductivity,
wherein the photoelectric conversion layer is electrically connected to the charge accumulation part through the first contact plug and the contact.

12. The solid-state imaging device of claim 1, wherein the diffusion region, the first gate electrode, and the first contact plug contain silicon as a main component.

13. A solid-state imaging device comprising:
an imaging pixel region where a plurality of imaging pixels are arranged on a substrate,
wherein each imaging pixel includes
a diffusion region formed in the substrate,
a first gate electrode formed lateral to the diffusion region on the substrate,
a first insulating film formed on the diffusion region, and
a first contact plug connected to the diffusion region so as to penetrate the first insulating film and made of semiconductor,
the first contact plug is, at a lower part thereof, embedded in the first insulating film, and is, at an upper part thereof, exposed through the first insulating film,
silicide is formed on the upper part of the first contact plug, and
the diffusion region and the first gate electrode are covered by the first insulating film,
the solid-state imaging device further comprises:
a second gate electrode formed on the substrate in a region opposite to the first gate electrode relative to the diffusion region; and
a contact formed on the first contact plug and having conductivity, wherein
part of an upper lateral part of the first contact plug is positioned on a sidewall formed above or lateral to the first gate electrode,
the remaining part of the upper lateral part of the first contact plug is positioned on a sidewall formed above or lateral to the second gate electrode,
a recessed part is formed at an upper part of the first contact plug above the diffusion region, and
the contact is connected to the recessed part formed at the upper part of the first contact plug.

14. A method for manufacturing a solid-state imaging device including an imaging pixel region where a plurality of imaging pixels are arranged on a substrate, the method comprising:
a step of forming a diffusion region corresponding to each imaging pixel in the imaging pixel region in the substrate;
a step of forming an insulating film on the diffusion region;
a step of forming, in the insulating film, a first hole through which the diffusion region is exposed;
a step of forming a semiconductor film on the insulating film such that the first hole is filled with the semiconductor film;
a step of forming, from the semiconductor film, a first contact plug filling the first hole and exposed through the insulating film; and
a step of forming silicide on the first contact plug exposed through the insulating film, wherein
a peripheral edge part of an upper part of the first contact plug is formed so as to extend over the insulating film,
the method further includes a step of forming, before the step of forming the insulating film, a gate electrode lateral to the diffusion region on the substrate,
wherein the step of forming the first hole includes a step of forming a second hole through which the gate electrode is exposed,
the step of forming the first contact plug includes a step of forming, from the semiconductor film, a second contact plug filling the second hole and exposed through the insulating film,
at the step of forming the silicide, silicide is simultaneously formed on the second contact plug exposed through the insulating film, and
a peripheral edge part of an upper part of the second contact plug extends over the insulating film.

15. The method of claim 14, wherein
at the step of forming the first contact plug, at least part of a region, where the first contact plug is not formed, of the insulating film in a thickness direction thereof remains.

16. The method of claim 14, wherein
the diffusion region and the first contact plug contain silicon as a main component.

* * * * *